US009070424B2

(12) United States Patent
Youn et al.

(10) Patent No.: US 9,070,424 B2
(45) Date of Patent: Jun. 30, 2015

(54) SENSE AMPLIFIER CIRCUITRY FOR RESISTIVE TYPE MEMORY

(75) Inventors: YongSik Youn, Cupertino, CA (US); Sooho Cha, Seoul (KR); Chan-kyung Kim, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 205 days.

(21) Appl. No.: 13/538,869

(22) Filed: Jun. 29, 2012

(65) Prior Publication Data
US 2014/0003124 A1 Jan. 2, 2014

(51) Int. Cl.
G11C 11/00 (2006.01)
G11C 7/06 (2006.01)
G11C 13/00 (2006.01)
G11C 11/16 (2006.01)

(52) U.S. Cl.
CPC ............ *G11C 7/065* (2013.01); *G11C 13/0002* (2013.01); *G11C 13/004* (2013.01); *G11C 2013/0042* (2013.01); *G11C 11/1673* (2013.01)

(58) Field of Classification Search
CPC .. G11C 7/065; G11C 13/004; G11C 13/0002; G11C 11/1673; G11C 2013/0042
USPC .................. 365/148, 210, 207, 233.1, 230.06
See application file for complete search history.

(56) References Cited

U.S. PATENT DOCUMENTS

| 6,055,178 | A | 4/2000 | Naji |
| 6,111,781 | A | 8/2000 | Naji |
| 7,839,676 | B2 | 11/2010 | Kurose et al. |
| 2010/0054019 | A1* | 3/2010 | Toda .............................. 365/148 |
| 2011/0235398 | A1* | 9/2011 | Hosono ......................... 365/148 |
| 2012/0044746 | A1* | 2/2012 | Chung .......................... 365/148 |
| 2012/0057400 | A1 | 3/2012 | Kim et al. |

* cited by examiner

*Primary Examiner* — Richard Elms
*Assistant Examiner* — Mohammed A Bashar
(74) *Attorney, Agent, or Firm* — Renaissance IP Law Group LLP

(57) ABSTRACT

Example embodiments include a resistive type memory sense amplifier circuit including differential output terminals, first and second input terminals, a pre-charge section, and other components arranged so that current is re-used during at least a "set" or "amplification" stage of the sense amplifier circuit, thereby reducing overall current consumption of the circuit, and improving noise immunity. A voltage level of a high-impedance output terminal is caused to swing in response to a delta average current between a reference line current and a bit line current. During a "go" or "latch" stage of operation, a logical value "0" or "1" is latched at the differential output terminals based on positive feedback of a latch circuit. Also disclosed is a current mirror circuit, which can be used in conjunction with the disclosed sense amplifier circuit. In yet another embodiment, a sense amplifier circuit includes the capability of read/re-write operation.

24 Claims, 18 Drawing Sheets (Precharge)

(Amplification)

(Latch+Rewrite)

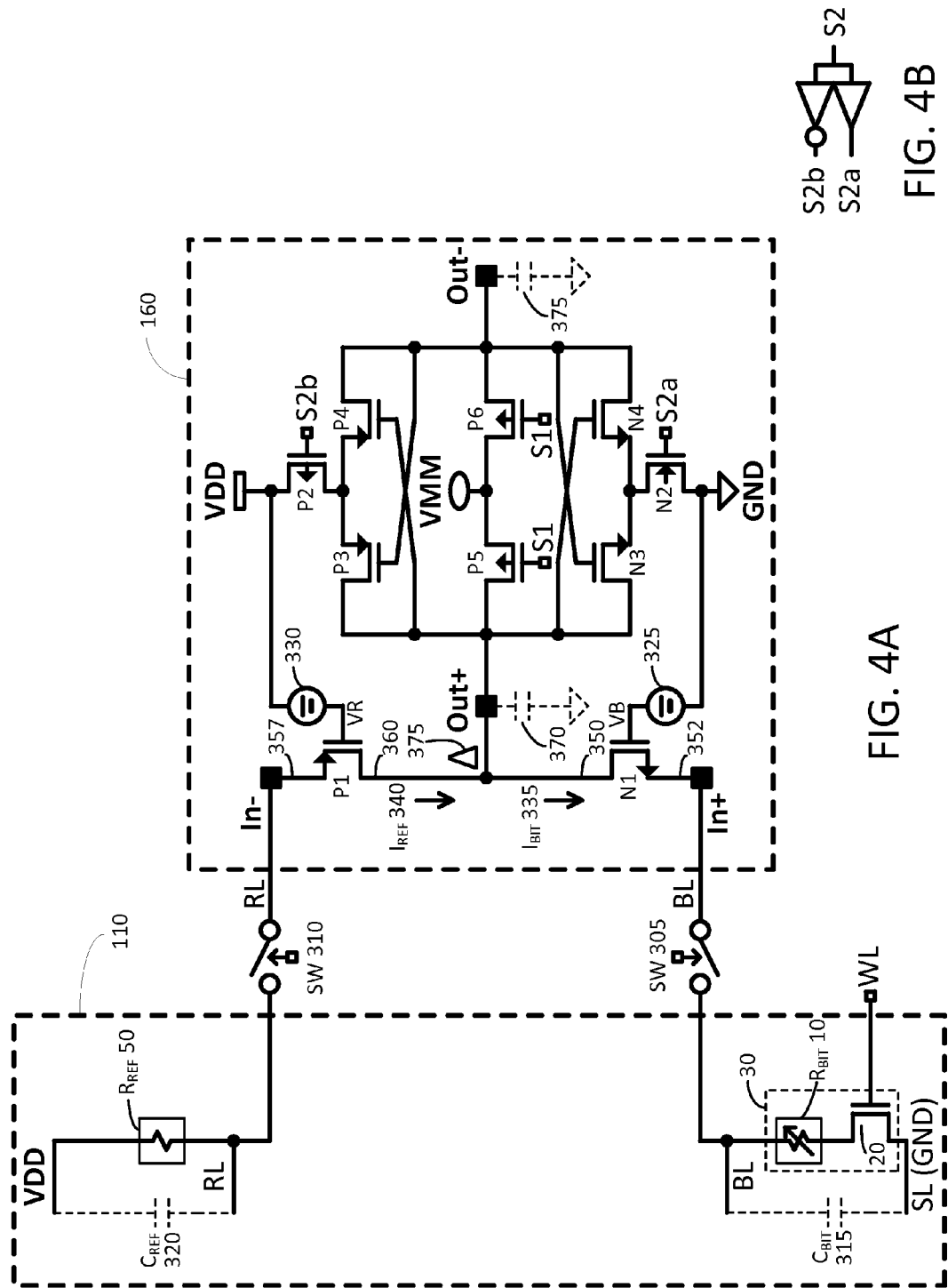

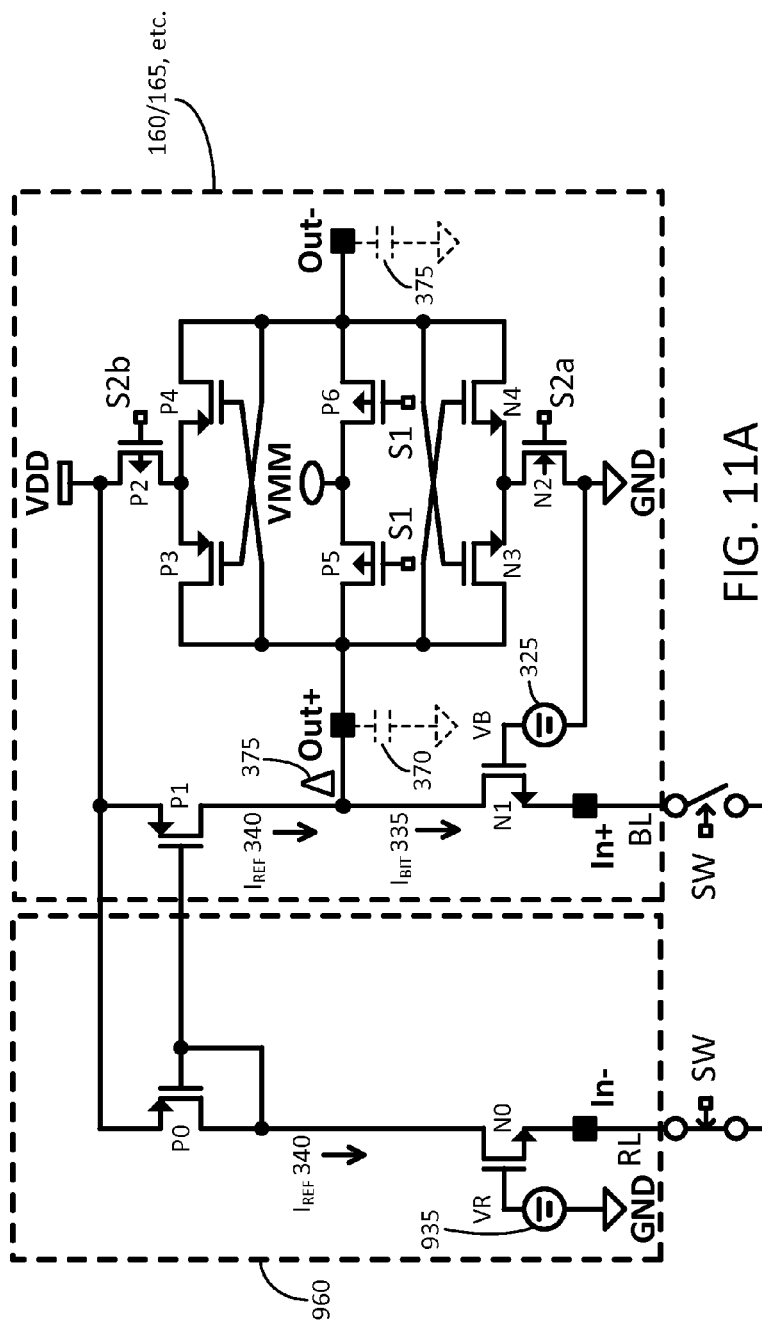
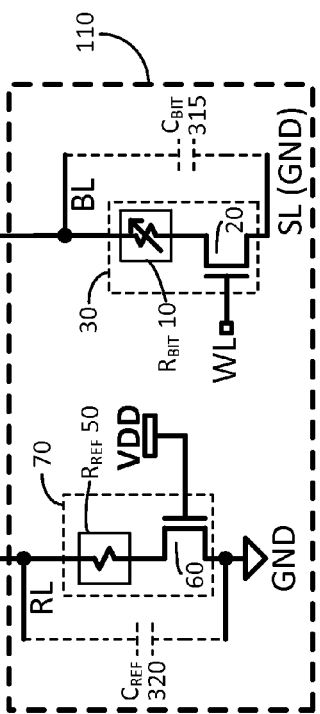
FIG. 11A
FIG. 11B

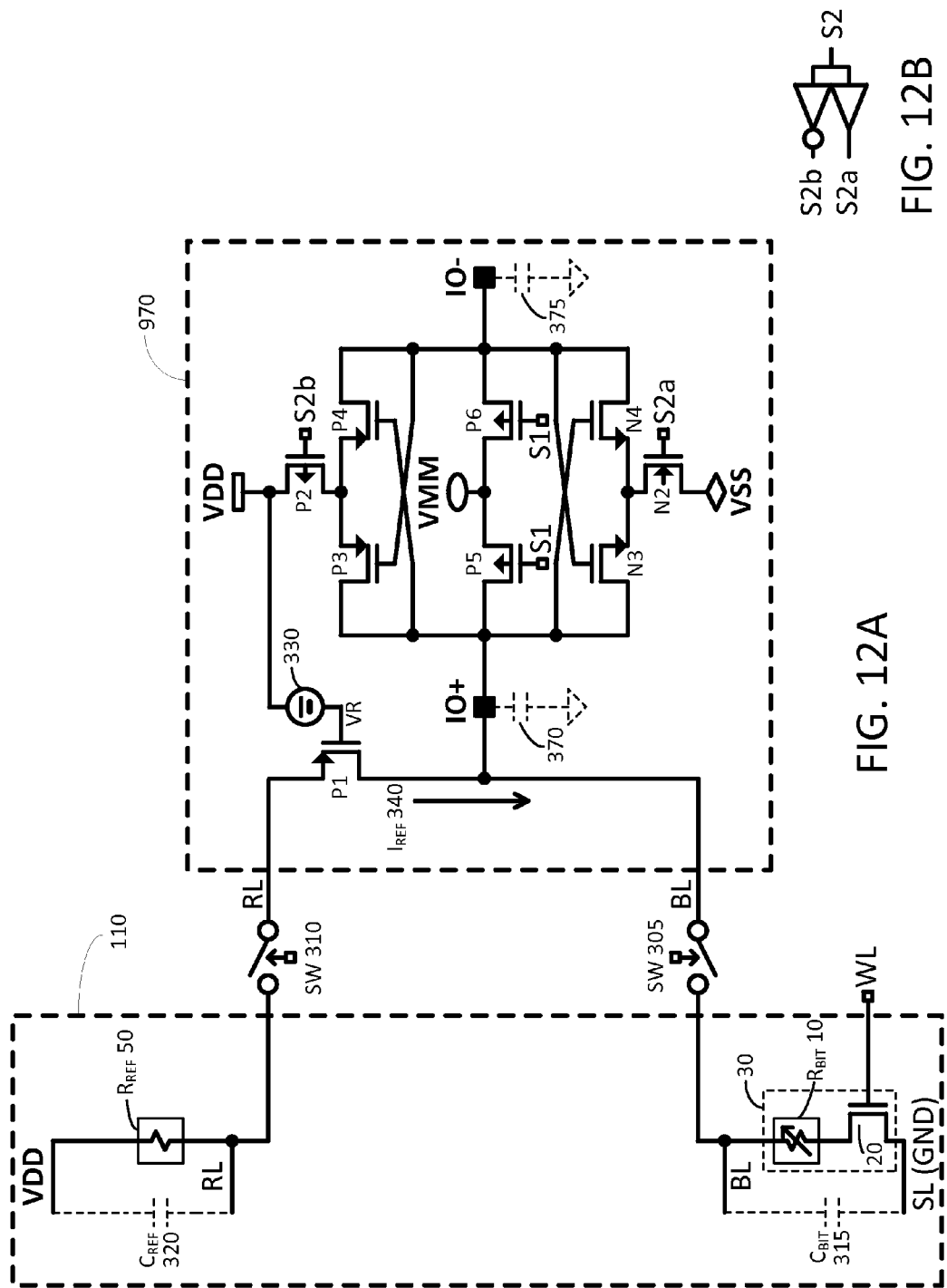

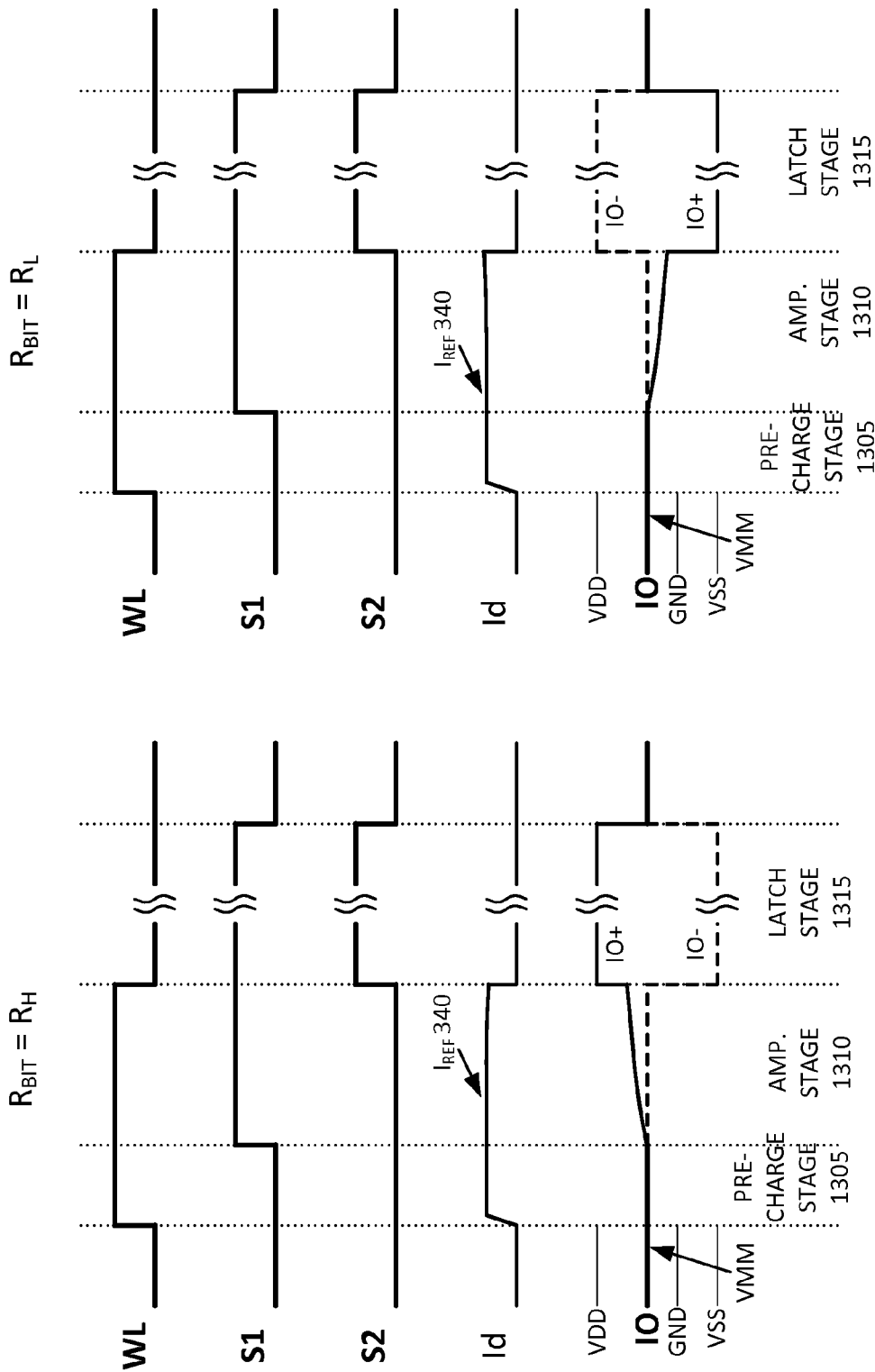

SENSE AMPLIFIER CIRCUITRY FOR RESISTIVE TYPE MEMORY

BACKGROUND

The present inventive concepts relate to sense amplifiers for resistive type memory circuits, and more particularly to sense amplifiers having current re-using capabilities, high noise immunity characteristics, and in some embodiments, read/re-write operation modes.

Resistive type memories encompass a new generation of non-volatile memory and are expected to become more prevalent in the marketplace. Resistive type memories can include, for example, spin transfer torque (STT) magnetoresistive random-access memory (MRAM), MRAM (of the non-STT variety), memristor RAM, ReRAM, CBRAM, and the like.

FIG. 1A is a circuit diagram of a sense amplifier according to the prior art. Referring to FIG. 1A, a latch circuit is configured by MOS transistors M1, M2, M3, and M4. MOS transistors M5 and M6 correspond to the read current source IR1 and the reference current source IR2, respectively. A sense amplifier is configured by MOS transistors M7 and M8. An operation of the read circuit 15 includes (a) a pre-charge mode, (b) an amplification mode, and (c) a latch+rewrite mode. The modes are described below with reference to FIGS. 1B-1D. In an initial state, control signals φ1, φ2, and φ3 from a switch controller are set at a low ("L") state.

FIGS. 1B-1D are equivalent circuit diagrams of the circuit diagram of FIG. 1A associated with different stages of operation, in accordance with the prior art.

FIG. 1B shows an equivalent circuit in the pre-charge mode. The control signal φ2 is set at a high ("H") state to start pre-charging a read current path. A pre-charge current flows from the pre-charge transistors M5 and M6 (PMOS transistors) to the MRAM cell 13 and the reference cell 13' through the cross-coupled transistors M3 and M4 (NMOS transistors) serving as a part of the latch circuit and clamp transistors M11 and M12 (NMOS transistors) of FIG. 1A. In the pre-charge mode and a stable state, read data Out and /Out are set at a voltage close to a power supply voltage VSS by the pre-charge transistors M5 and M6 and an equalize transistor Meq (PMOS transistor). Therefore, the transistors M1 and M2 are in off states, and the latch circuit including transistors M1 to M4 does not operate.

FIG. 1C shows an equivalent circuit in an amplification mode. The control signal φ1 is set at "H", and the transistors M5, M6, and Meq are turned off. The data Out and /Out decrease from a power supply voltage VDD by threshold voltages of the transistors M1 and M2, amplification by positive feedback of the latch circuit including the MOS transistors M1 to M4, and the data Out and /Out are determined. At this time, the read current path is identical with a drive current path of the latch circuit, and the control signal φ1 goes to "H", so that the operation continuously is shifted from the pre-charge mode to the amplification mode. Although present in the overall circuit during the amplification mode, the clamp transistors M11 and M12 are not shown in FIG. 1C.

FIG. 1D shows an equivalent circuit in an latch+rewrite mode. As shown in FIG. 1D, when a voltage difference between outputs Out and /Out is sufficiently large, the control signal φ3 is set at "H" to turn the boost transistors M7 and M8 on, and amplification of the latch circuit including the transistors M1 to M4 is accelerated. When an output from the latch circuit, i.e., the data Out and /Out are determined, rewriting is performed.

Conventional sense amplifier technology used in resistive type memories can experience problems. For example, conventional sense amplifiers may suffer from excessive amounts of current usage because of separate lines and parallel currents used with bit lines and reference lines. As a result, the current consumption may be unacceptably high. Meanwhile, the noise immunity in prior art sense amplifier technology may be unacceptably low.

Other unique challenges are presented when attempting to develop sense amplifier technology associated with resistive type memories. For example, in an MRAM type memory cell, a destructive read or "read disturb" problem can occur if the sense amplifier causes excess current to flow through an MRAM memory cell when attempting to sense whether a "1" or a "0" is stored in the memory cell. In other words, the value of the memory cell can accidentally be switched from a "1" to a "0" or vice versa.

One approach to avoid the read disturb problem is for the sense amplifier to reduce the read current. However, unintended side effects of this approach can include slower response times, a reduction in the output signal level, a reduction in the data read rate, and higher susceptibility to unwanted electromagnetic noise and other disturbances. Such performance degradation is undesirable. Moreover, such electromagnetic noise itself can be disruptive to the data stored in the cell or to the sense amplifier output signals.

It would be desirable to provide a sense amplifier circuit for resistive type memories, which provides low current consumption, strong noise immunity, acceptably low supply voltage, fast response times, and read/re-write capability.

BRIEF SUMMARY

According to one embodiment of the inventive concept, a resistive type memory sense amplifier circuit includes a first differential output terminal configured to output a first output signal, a second differential output terminal configured to output a second output signal opposite the first output signal, a first input terminal coupled to a bit line associated with a resistive type memory cell, a second input terminal coupled to a reference line associated with a reference memory cell, a first transistor coupled to the second input terminal and to the first differential output terminal, the first transistor being configured to conduct a reference line current, and a second transistor coupled to the first differential output terminal and arranged in series with the first transistor, the second transistor being configured to conduct a bit line current. A voltage level of the first differential output terminal is configured to swing responsive to a delta average current between the reference line current and the bit line current.

According to another example embodiment, a method includes, in a pre-charge stage of a sense amplifier circuit, pre-charging, by a pre-charge section, at least a bit line and a reference line, in an amplification stage of the sense amplifier circuit, causing a reference line current to flow through the reference line and a bit line current to flow through the bit line, and in the amplification stage of the sense amplifier circuit, causing a voltage swing at a first differential output terminal responsive to a delta average current between the reference line current and the bit line current. Causing the bit line current to flow through the bit line includes re-using at least some of the reference line current flowing through the reference line. In addition, in a latch stage of the sense amplifier circuit, the method may include latching, by a latch circuit, a logical value "0" or logical value "1" at first or second differential output terminals, respectively, using positive feedback of the latch circuit.

According to yet another example embodiment, a memory device is provided including a plurality of word lines, a plurality of bit lines arranged to intersect with the word lines, a plurality of memory blocks, each memory block including resistive type memory cells arranged at intersection portions between the word lines and the bit lines, a plurality of sense amplifier circuits, each sense amplifier circuit being associated with a corresponding bit line and a corresponding memory cell of at least one of the memory blocks, a current mirror circuit coupled to the plurality of sense amplifier circuits and configured to mirror a reference line current during at least an amplification stage of each of the sense amplifier circuits. Moreover, the bit lines are configured to re-use at least some of the mirrored reference line current. In addition, some embodiments include a sense amplifier circuit having read/re-write capability.

The foregoing and other features and advantages of the inventive concept will become more readily apparent from the following detailed description of the example embodiments, which proceeds with reference to the accompanying drawings.

BRIEF DESCRIPTION OF THE DRAWINGS

FIG. 4A is an example circuit diagram of a sense amplifier of FIG. 2 associated with memory cells of the memory device of FIG. 2, in accordance with one embodiment of the inventive concept.

FIG. 4B is an example control signal circuit for generating control signals used in connection with the sense amplifier circuit of FIG. 4A.

FIG. 11A is an example circuit diagram of a sense amplifier of FIG. 2 associated with a current mirror, in accordance with another embodiment of the inventive concept.

FIG. 11B is an example control signal circuit for generating control signals used in connection with the sense amplifier circuit of FIG. 11A.

FIG. 12A is an example circuit diagram of a sense amplifier including read/re-write capability, in accordance with yet another embodiment of the inventive concept.

FIG. 12B is an example control signal circuit for generating control signals used in connection with the sense amplifier circuit of FIG. 12A.

FIG. 13A is an example waveform diagram showing waveforms associated with different stages of the sense amplifier circuit of FIG. 12A when a memory cell resistance is previously set to high, in accordance with some embodiments of the inventive concept.

FIG. 13B is an example waveform diagram showing waveforms associated with different stages of the sense amplifier circuit of FIG. 12A when a memory cell resistance is previously set to low, in accordance with some embodiments of the inventive concept.

DETAILED DESCRIPTION

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first circuit could be termed a second circuit, and, similarly, a second circuit could be termed a first circuit, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Figure 1A:
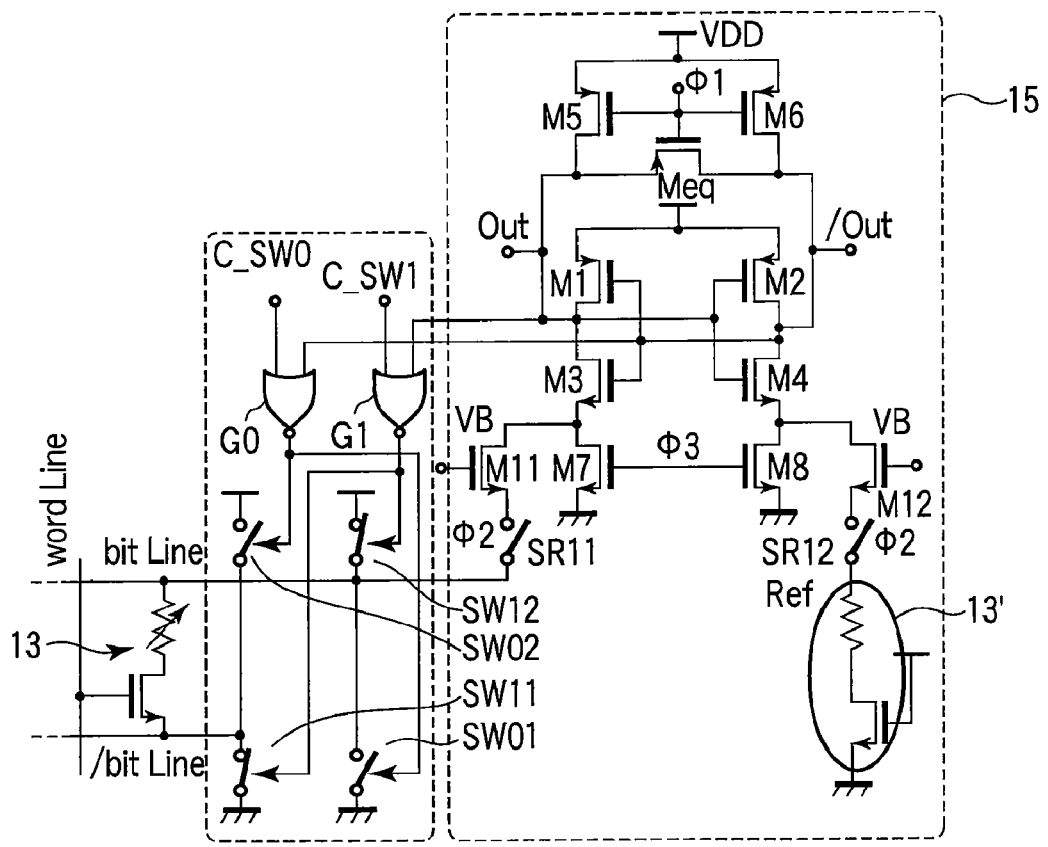
FIG. 1A is a circuit diagram of a sense amplifier according to the prior art.
Figure 1B:
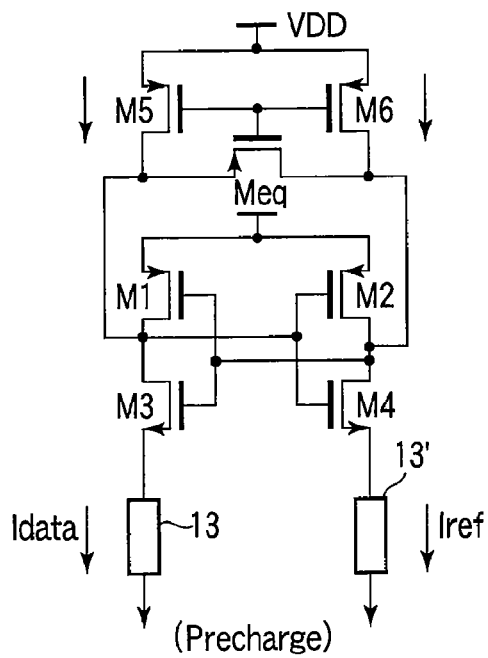
FIGS. 1B-1D are equivalent circuit diagrams of the circuit diagram of FIG. 1A associated with different stages of operation, in accordance with the prior art.
Figure 1C:
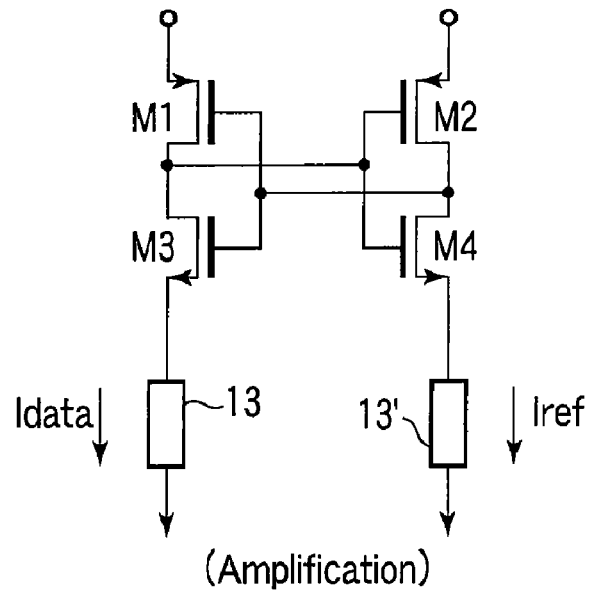
Figure 1D:
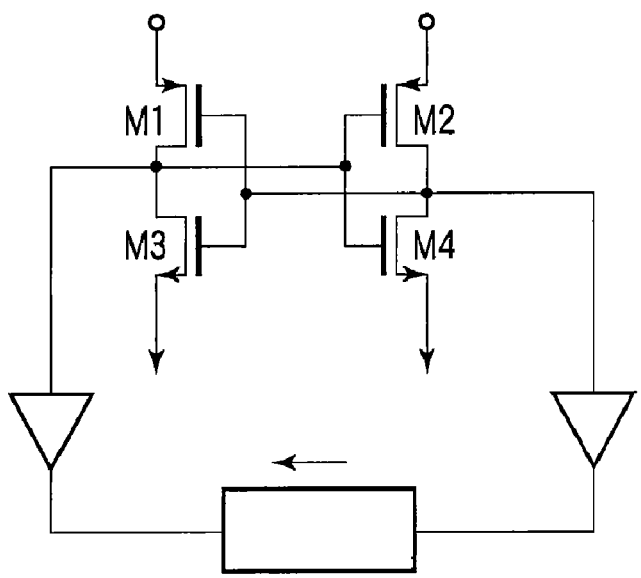
Figure 2:
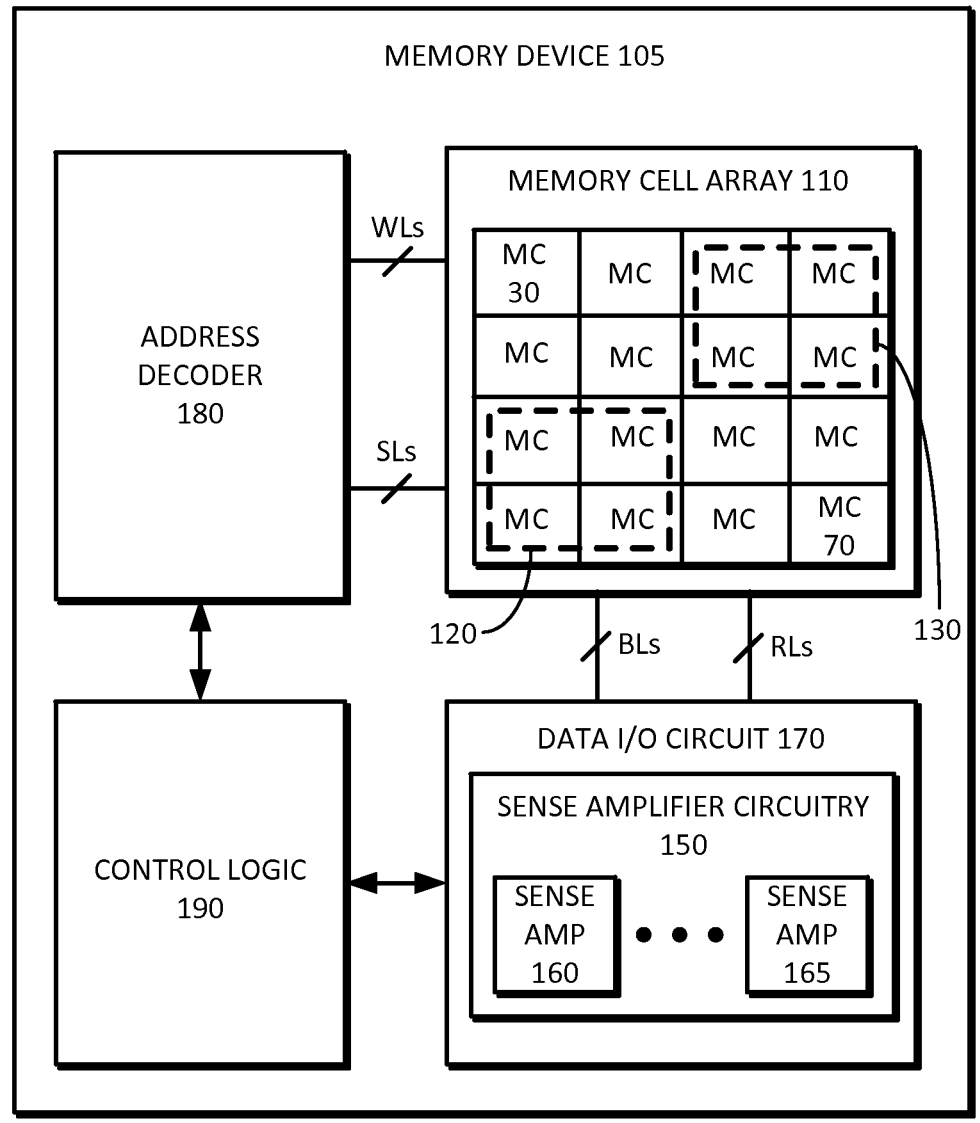
FIG. 2 is an example block diagram of a memory device including sense amplifier circuitry, in accordance with embodiments of the inventive concept.

FIG. 2 is an example block diagram of a memory device 105 including sense amplifier circuitry 150, in accordance with embodiments of the inventive concept. Referring to FIG. 2, the memory device 105 includes a memory cell array 110, a data I/O circuit 170, an address decoder 180, and a control logic 190. The data I/O circuit 170 may include the sense amplifier circuitry 150 for sensing or reading bit information stored in memory cell array 110, in accordance with embodiments of the inventive concept.

Referring to FIG. 2, the memory cell array 110 may have a plurality of memory cells MC 30, each of which stores one or more data bits. The memory cells MC may be connected to a plurality of word lines WLs, a plurality of source lines SLs, and a plurality of bit lines BLs. The bit lines BLs may be arranged to intersect with the word lines WLs. In addition, some of the memory cells may be reference memory cells 70, as further described below. The reference memory cells 70 may be connected to a plurality of reference lines RLs.

The memory cells may be arranged at intersection portions (not shown) between the word lines and the bit lines. The memory cells 30 may be grouped into memory blocks such as blocks 120 and 130. For example, for a 1 Mb memory block, one thousand (1000) word lines and one thousand (1000) bit lines can be associated with the memory block. Thus, each bit line associated with such a block would have one thousand (1000) memory cells associated therewith. It will be understood, however, that any suitable number of word lines, bit lines, and/or memory cells can be associated with each block. The sense amplifier circuitry 150 may include a plurality of sense amplifier circuits (e.g., 160 and 165). Each sense amplifier circuit is associated with a corresponding bit line of one of the memory blocks (e.g., 120 and 130), respectively. In other words, each bit line BL has a corresponding sense amplifier (e.g., 160, 165) associated therewith.

The address decoder 180 may be connected to the memory cell array 110 via the word lines WLs and source lines SLs. The address decoder 180 may operate responsive to the control of the control logic 190. The address decoder 180 may decode an input address to select the word lines WLs and source lines SLs. The address decoder 180 may receive power (e.g., a voltage or a current) from the control logic 190 to provide it to a selected or unselected word line.

The data input/output circuit 170 may be connected to the memory cell array 110 via the bit lines BLs. More specifically, each of the sense amplifiers (e.g., 160 and 165) can be coupled to a corresponding bit line of one of the memory blocks (e.g., 120 and 130). The data input/output circuit 170 may operate responsive to the control of the control logic 190. The data input/output circuit 170 may select a bit line in response to a bit line selection signal (not shown) from the address decoder 180. The data input/output circuit 170 may receive power (e.g., a voltage or a current) from the control logic 190 to provide it to a selected bit line.

The control logic 190 may be configured to control an overall operation of the memory device 105. The control logic 190 may be supplied with external power and/or control signals. The control logic 190 may generate power needed for an internal operation using the external power. The control logic 190 may control read, write, and/or erase operations in response to the control signals.

Figure 3A:
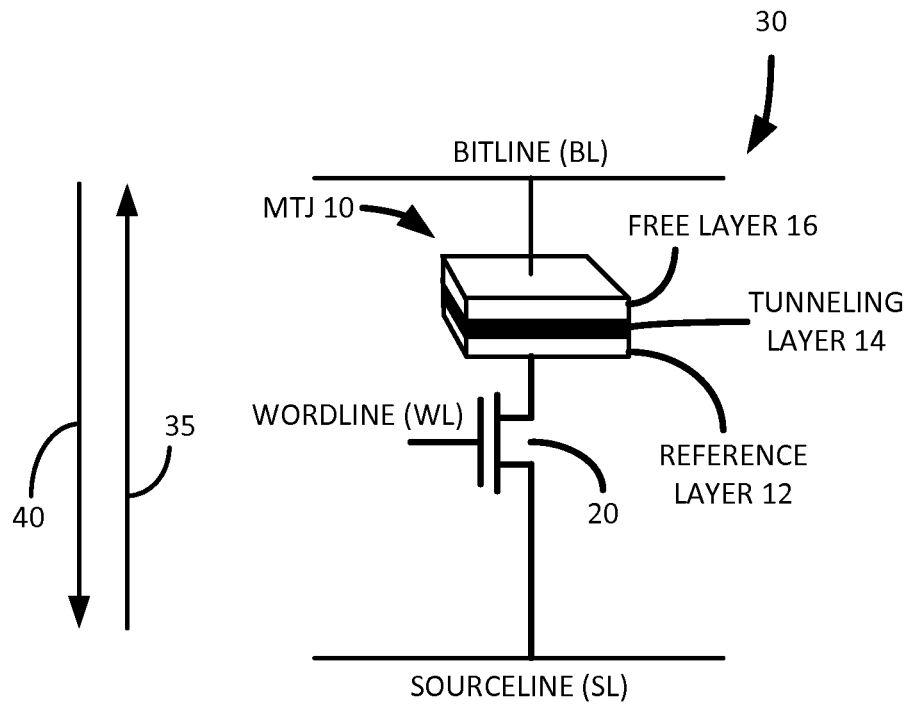
FIGS. 3A and 3B are a schematic diagram of an example STT MRAM memory cell, which can be included in the memory array of the memory device of FIG. 2.
Figure 3B:
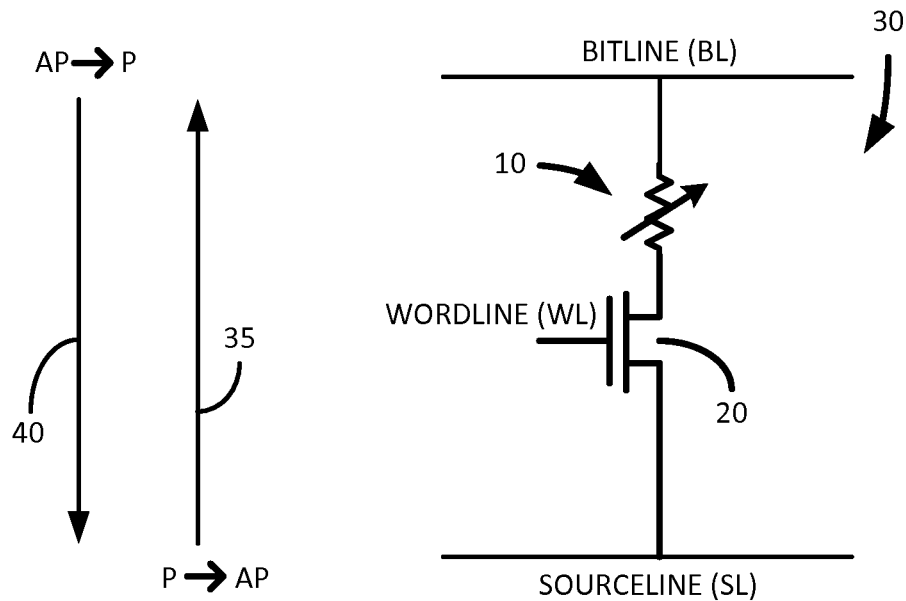

FIGS. 3A and 3B are a schematic diagram of an example STT MRAM memory cell 30 included in the memory cell array 110 of the memory device 105 of FIG. 2.

In some embodiments, the memory cell array 110 includes a plurality of spin transfer torque (STT) magnetoresistive random-access memory (MRAM) memory cells. It will be understood, however, that inventive concepts described herein apply to resistive memories of other types, such as MRAM (of the non-STT variety), memristor RAM, ReRAM, CBRAM, and the like.

FIG. 3A shows a magnetic tunnel junction (MTJ) 10, which forms a variable resistor in an STT-MRAM type memory cell, and an associated select transistor 20, together forming an STT-MRAM cell 30. The MTJ 10 includes a reference or pinned layer 12, a free layer 16, and a tunneling layer 14 disposed between the reference layer 12 and the free layer 16. Transistor 20 is often an NMOS transistor due to its inherently higher current drive, lower threshold voltage, and smaller area relative to a PMOS transistor. The current used to write a "1" in MRAM 30 can be different than the current used to write a "0". The asymmetry in the direction of current flow during these two write conditions is caused by the asymmetry in the gate-to-source voltage of transistor 20.

In the following description, an MRAM cell is defined as being in a logic "0" state when the free and reference layers of its associated MTJ are in a parallel (P) state, i.e., the MTJ exhibits a low resistance. Conversely, an MRAM cell is defined as being in a logic "1" state when the free and reference layers of its associated MTJ are in an anti-parallel (AP) state, i.e., the MTJ exhibits a high resistance. It will be understood that in other embodiments, the MRAM cell can be defined as being in the logic "0" state when in an AP state, and the logic "1" state when in a P state. Furthermore, in the following, it is assumed that the reference layer of the MTJ 10 faces its associated select transistor, as shown in FIG. 3A.

Therefore, in accordance with the discussion above, a current flowing along the direction of arrow 35 (i.e., the up direction) either (i) causes a switch from the P state to the AP state thus to write a "1", or (ii) stabilizes the previously established AP state of the associated MTJ. Likewise, a current flowing along the direction of arrow 40 (i.e., the down direction) either (i) causes a switch from the AP state to the P state thus to write a "0", or (ii) stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 either (i) causes a switch from the AP state to the P, or (ii) stabilizes the previously established P state of the associated MTJ. Likewise, in such embodiments, a current flowing along the direction of arrow 40 either (i) causes a switch from the P state to the AP state, or (ii) stabilizes the previously established AP state.

FIG. 3B is a schematic representation of MRAM 30 of FIG. 3A in which MTJ 10 is shown as a storage element whose resistance varies depending on the data stored therein. The MTJ 10 changes its state (i) from P to AP when the current flows along arrow 35, and/or (ii) from AP to P when the current flows along arrow 40.

The voltage required to switch the MTJ 10 from an AP state to a P state, or vice versa, must exceed a critical value $V_c$. The current corresponding to this voltage is referred to as the critical or switching current $I_c$. Under a normal operating mode, to transition from the P state (i.e., low resistance state) to AP state (i.e., high resistance state), a positive voltage of $V_c$ is applied so that a current level of at least the switching current $I_c$ flows through the memory cell. Once in the AP state, removing the applied voltage does not affect the state of the MTJ 10. Likewise, to transition from the AP state to the P state under the normal operating mode, a negative voltage of $V_c$ is applied so that a current level of at least the switching current $I_c$ flows through the memory cell in the opposite direction. Once in the P state, removing the applied voltage does not affect the state of the MTJ 10.

In other words, MTJ 10 can be switched from an anti-parallel state (i.e., high resistance state, or logic "1" state) to a parallel state so as to store a "0" (i.e., low resistance state, or logic "0" state). Assuming that MTJ 10 is initially in a logic "1" or AP state, to store a "0", under the normal operating mode, a current at least as great or greater than the critical current $I_c$ is caused to flow through transistor 20 in the direction of arrow 40. To achieve this, the source node (SL or source line) of transistor 20 is coupled to the ground potential via a resistive path (not shown), a positive voltage is applied to the gate node (WL or word line) of transistor 20, and a positive voltage is applied to the drain node (BL or bit line) of transistor 20.

As mentioned above, MTJ 10 can also be switched from a parallel state to an anti-parallel state so as to store a "1". Assuming that MTJ 10 is initially in a logic "0" or P state, to store a "1", under the normal operating mode, a current at least as great or greater than the critical current $I_c$ is caused to flow through transistor 20 in the direction of arrow 35. To achieve this, node SL is supplied with a positive voltage via a resistive path (not shown), node WL is supplied with a positive voltage, and node BL is coupled to the ground potential via a resistive path (not shown).

FIG. 4A is an example circuit diagram of the sense amplifier 160 of FIG. 2 associated with memory cells (e.g., 30) of the memory device 105 of FIG. 2, in accordance with one embodiment of the inventive concept. It will be understood that while a single memory cell 30 is shown, any suitable number of memory cells can be coupled to or otherwise associated with the sense amplifier 160.

Embodiments of the inventive concept include a sense amplifier circuit for resistive type memories, which provides low current consumption, strong noise immunity, acceptably low supply voltage, fast response times, and read/re-write capability.

The sense amplifier circuit 160 includes a first differential output terminal Out+ configured to output a first output signal and a second differential output terminal Out− configured to output a second output signal opposite the first output signal. The output signals correspond to either a logical value "0" or a logical value "1" depending on the bit data stored in the memory cell 30.

A first input terminal In+ is coupled to a bit line BL associated with the resistive type memory cell 30. A second input terminal In− is coupled to a reference line RL associated with a reference resistor $R_{REF}$ 50. The reference resistor $R_{REF}$ 50 is used as a reference when determining whether the memory cell 30 stores a logical value "0" (e.g., when $R_{BIT}$ is equal to $R_L$) or logical value "1" (e.g., when $R_{BIT}$ is equal to $R_H$). Although not shown in FIG. 4A, it will be understood that in some embodiments, there may be a PMOS select transistor coupled to the reference resistor $R_{REF}$, if a PMOS transistor is available. The gate terminal of the select transistor 20 of the memory cell 30 is coupled to a corresponding word line WL.

The resistor $R_{REF}$ 50 can be designed to have a certain resistance. For example, the resistor $R_{REF}$ 50 can have an intermediate resistance between the high resistance $R_H$ and the low resistance $R_L$ of the $R_{BIT}$ resistor. In one example embodiment, the $R_{REF}$ resistor has a resistance of $2/(1/R_H + 1/R_L)$. Where the $R_{REF}$ resistor is designed to have the resistance of $2/(1/R_H + 1/R_L)$, the voltage VB generated by voltage generator 325 is equal to or substantially equal to voltage VR generated by voltage generator 330.

In another example embodiment, the $R_{REF}$ resistor has a resistance of either $R_H$ or $R_L$. Where the $R_{REF}$ resistor is configured to have the resistance of $R_H$, the reference line current $I_{REF}$ 340 can be modulated or otherwise adjusted by the voltage VR generated by the voltage generator 330, which is applied to the gate terminal of the transistor P1. At the same time, the bit line current $I_{BIT}$ 335 can be modulated or otherwise adjusted by the voltage VB generated by the voltage generator 325, which is applied to the gate terminal of transistor N1. In this embodiment, VR is greater than VB.

Where the $R_{REF}$ resistor is configured to have the resistance of $R_L$, the reference line current $I_{REF}$ 340 can be modulated or otherwise adjusted by the voltage VR generated by the voltage generator 330, which is applied to the gate terminal of the transistor P1. At the same time, the bit line current $I_{BIT}$ 335 can be modulated or otherwise adjusted by the voltage VB generated by the voltage generator 325, which is applied to the gate terminal of the transistor N1. In this embodiment, VB is greater than VR.

To facilitate the explanation of the operation of the sense amplifier 160, the $R_{REF}$ resistor will be assumed to have a resistance of $2/(1/R_H + 1/R_L)$ and it will also be assumed that voltage VB is equal to or substantially equal to voltage VR.

Due to the memory cell circuitry and associated conductive lines, a bit line capacitor $C_{BIT}$ 315 (i.e., parasitic capacitance) exists between the bit line BL and the source line SL. Similarly, a reference line capacitor $C_{REF}$ 320 (i.e., parasitic capacitance) exists between the reference line RL and a positive power supply voltage node VDD. The bit line capacitor 315 and the reference line capacitor 320 are pre-charged during a pre-charge phase of the sense amplifier circuit 160, as further described in detail below. Switches 305 and 310 are configured to connect or disconnect the sense amplifier circuit 160 to or from the memory and reference cells of the memory cell array 110.

The sense amplifier operates in three primary stages: A) a "ready" or "pre-charge" stage, B) a "set" or "amplification" stage, and C) a "go" or "latch" stage. The various operating stages will be discussed in further detail below.

The sense amplifier circuit includes a first transistor P1 coupled to a power supply (e.g., VDD), to the reference line RL, and to the first differential output terminal Out+. The first transistor P1 is configured to conduct a reference line current $I_{REF}$ 340. The sense amplifier circuit also includes a second transistor N1 coupled to the bit line BL and to the first differential output terminal Out+. The second transistor N1 is configured to conduct a bit line current $I_{BIT}$ 335.

The sense amplifier circuit 160 further includes a pre-charge section coupled to an intermediate power supply voltage node VMM. The pre-charge section can include, for example, a first pre-charge transistor P5 coupled to the first differential output terminal Out+ and to the intermediate power supply voltage node VMM, and a second pre-charge transistor P6 coupled to the second differential output terminal Out− and to the intermediate power supply voltage node VMM. The pre-charge section operates during a pre-charge stage of the sense amplifier circuit. The transistors P5 and P6 are preferably enhancement mode PMOS loading type transistors, i.e., digital mode on/off type transistors. It will be understood that other types of MOS transistors can be used without departing from the inventive concepts disclosed herein.

The intermediate power supply voltage node VMM has a voltage level between a power supply voltage VDD and a ground voltage GND. In some embodiments, the voltage level of the intermediate power supply voltage node VMM can be one-half (i.e., ½), or thereabout, of the power supply voltage VDD. In some embodiments, the voltage level of the intermediate power supply voltage node VMM can be two-thirds (i.e., ⅔), or thereabout, of the power supply voltage VDD. It will be understood that other suitable intermediate power supply voltage levels can be used. Signal-wise, the intermediate power supply voltage node VMM can also function as AC ground for one or more signals or components of the sense amplifier circuit 160.

During the "ready" or "pre-charge" stage of operation, the pre-charge transistors P5 and P6 each receives a pre-charge control signal S1 at its gate. The pre-charge control signal S1 can be generated by the control logic 190 (of FIG. 2). The pre-charge transistor P5 generates at least a portion of the bit line current $I_{BIT}$ 335, which pre-charges at least the bit line BL and the bit line capacitor $C_{BIT}$ 315 associated with the memory cell 30, through the transistor N1, during the "ready" or "pre-charge" stage of the sense amplifier circuit responsive to the pre-charge control signal S1. In addition, the parasitic capacitance 370 associated with the first differential output terminal Out+ is charged. Moreover, the pre-charge transistor P5 generates at least a portion of the reference line current $I_{REF}$ 340, which pre-charges at least the reference line RL and the reference line capacitor $C_{REF}$ 320, through the transistor P1, during the "ready" or "pre-charge" stage of the sense amplifier circuit responsive to the pre-charge control signal S1. The pre-charge transistor P6 receives the pre-charge control signal S1 and pre-charges at least a parasitic capacitance 375 associated with the second differential output terminal Out− during the "ready" or "pre-charge" stage of the sense amplifier circuit responsive to the pre-charge control signal S1.

During the "set" or "amplification" stage of operation, the sense amplifier senses bit data stored in the memory cell 30. The first differential output terminal Out+ may be a high-impedance output terminal Out+. A voltage level of the high-impedance output terminal swings in response to a delta average current 375 between the reference line current $I_{REF}$ 340 and the bit line current $I_{BIT}$ 335. In other words, there can exist a difference in the magnitude of the reference line current $I_{REF}$ 340 and the bit line current $I_{BIT}$ 335. Such difference is referred to herein as the delta average current 375. The delta average current 375 causes the voltage level of the high-impedance output terminal Out+ to swing in one direction or another depending on the bit value stored in the memory cell 30. The voltage swing does not depend on negative resistance support at the "set" or "amplification" stage, which would otherwise be provided by transistors P3 and P4, or other latch components. The settling time of the output voltage, the level of noise immunity, signal averaging, and the like, depend at least in part on the parasitic capacitance of the output terminals (e.g., 370 and/or 375), the parasitic capacitance due to $C_{BIT}$ 315, and/or the parasitic capacitance due to $C_{REF}$ 320. Without the grounded parasitic capacitances, the output voltage swing would be abrupt and susceptible to spikes and other noise interference. In addition, the current and signal averaging enhance the noise immunity characteristics of the circuit. The accuracy of the output voltage depends on the bit value stored in the memory cell 30, which itself depends on the resistance of the $R_{BIT}$ 10, i.e., whether the $R_{BIT}$ 10 is configured as $R_H$ or $R_L$.

Put differently, the voltage swing at the high-impedance output terminal can be caused by multiplying, by the delta average current 375, a parasitic impedance associated with the high-impedance output terminal Out+. The transistor P1 can increase the impedance of the output terminal Out+, which causes a more pronounced voltage swing. Because the reference line RL and the bit line BL are arranged in series, the bit line BL re-uses at least some of the reference line current $I_{REF}$ 340, thereby reducing current consumption during at least the "set" or "amplification" stage of operation. The reduction in the total current consumption during this stage can be up to one-half (i.e., up to 50% current consumption reduction relative to sense-amplifier circuits that do not have such current re-use circuitry and configuration). More specifically, if $I_{REF}$ 340 is greater than $I_{BIT}$ 335, then the voltage level of the high-impedance output terminal Out+ will swing higher, thereby indicating that a logical value "1" is stored in the memory cell 30. Conversely, if $I_{REF}$ 340 is less than $I_{BIT}$ 335, then the voltage level of the high-impedance output terminal Out+ will swing lower, thereby indicating that a logical value "0" is stored in the memory cell 30.

When $R_{BIT}=R_L$, the transistor N1 may operate in a triode region mode, while the transistor P1 may operate in a saturation region mode, during at least the "set" or "amplification" stage of the sense amplifier circuit. Conversely, when $R_{BIT}=R_H$, the transistor N1 may operate in a saturation region mode, while the transistor P1 may operate in a triode region mode, during at least the "set" or "amplification" stage of the sense amplifier circuit. The transistor N1 can be used to reduce the likelihood that a destructive write of the memory cell 30 occurs while reading or attempting to read bit data from the memory cell 30. Such destructive condition is sometimes referred to as "read disturb," the frequency of which is reduced by the presence of the transistor N1.

More specifically, the drain terminal 350 of the transistor N1 is directly coupled to the first differential output terminal Out+ and to the drain terminal 360 of the transistor P1. The source terminal 352 of the transistor N1 is coupled to the bit line BL associated with the memory cell 30. The source terminal 357 of the transistor P1 is coupled to the reference line RL associated with the reference resistor $R_{REF}$ 50. The transistor N1 is preferably an NMOS type transistor. The transistor P1 is preferably a PMOS type transistor. It will be understood that other types of MOS transistors can be used without departing from the inventive concepts disclosed herein.

Parasitic capacitances illustrated as the dashed-line grounded capacitors 370 and 375 contribute to the averaging of the bit line and reference line currents. As a result, noise immunity is strengthened and spikes of noise, switching noise, or other electromagnetic interference are less likely to cause disruption to the signals that are processed or output by the sense amplifier circuit 160. Higher signal power, better noise immunity, and better reliability of the logical output signals are some of the advantages that result from this example configuration.

During the "go" or "latch" stage of operation, the sense amplifier latches a logical value "0" or logical value "1" at the first or second differential output terminals (e.g., Out+, Out−) of the sense amplifier 160, as further described in detail below. The sense amplifier circuit 160 includes a cross-coupled latch circuit, which includes latch transistors P3, P4, N3, and N4. The cross-coupled latch circuit is connected to the first and second differential output terminals Out+ and Out−.

The cross-coupled latch circuit optionally includes a first latch enable transistor P2. Alternatively, the first latch enable transistor P2 can be global to each of plurality of sense amplifier circuits (e.g., 160 and 165 of FIG. 2). In other words, a single first global latch enable transistor P2 can be used to enable each of the latch circuits of each of the sense amplifier circuits in the memory device 150.

The cross-coupled latch circuit optionally includes a second latch enable transistor N2. Alternatively, the second latch enable transistor N2 can be global to each of plurality of sense amplifier circuits (e.g., 160 and 165 of FIG. 2). In other words, a single second global latch enable transistor N2 can be used to enable, together with the first latch enable transistor P2, each of the latch circuits of each of the sense amplifier circuits in the memory device 150.

The latch enable transistors P2 and N2 are configured to enable the "go" or "latch" stage of the sense amplifier circuit 160 responsive to a latch control signal S2b and a latch control signal S2a, respectively. In some embodiments, the latch control signals S2b and S2a are generated by the control logic 190 (of FIG. 2). The first latch enable transistor P2 is coupled to the positive power supply voltage node (e.g., VDD). The second latch enable transistor N2 is coupled to a ground voltage node GND.

The latch circuit includes a first latch transistor P3 coupled to the first latch enable transistor P2 and to the first differential output terminal Out+. A second latch transistor P4 is coupled to the first latch enable transistor P2 and to the second differential output terminal Out−. A third latch transistor N3 is coupled to the second latch enable transistor N2 and to the first differential output terminal Out+. A fourth latch transistor N4 is coupled to the second latch enable transistor N2 and to the second differential output terminal Out−.

The latch transistors are configured to latch, based on positive feedback, a logical value "0" or logical value "1" at the first or second differential output terminals Out+ or Out−, respectively, depending on a bit value stored in the resistive type memory cell 30, and responsive to the latch enable transistors P2 and N2 being turned on by the latch control signals S2b and S2a, respectively, during the "go" or "latch" stage of operation.

More specifically, a source terminal of the first latch transistor P3 is directly coupled to a drain terminal of the first latch enable transistor P2. Similarly, a source terminal of the second latch transistor P4 is directly coupled to a drain terminal of the first latch enable transistor P2. In addition, the source terminal of the third latch transistor N3 may be directly coupled to the drain terminal of the latch enable transistor N2. Similarly, the source terminal of the fourth latch transistor N4 may be directly coupled to the drain terminal of the latch enable transistor N2. The gate terminal of the first latch transistor P3 may be coupled to the second differential output terminal Out−. The gate terminal of the second latch transistor P4 may be coupled to the first differential output terminal Out+. The gate terminal of the third latch transistor N3 may be coupled to the second differential output terminal Out−. And the gate terminal of the fourth latch transistor N4 may be coupled to the first differential output terminal Out+.

The drain terminal of each of the first and third latch transistors (i.e., P3 and N3) may be coupled to the first differential output terminal Out+. The drain terminal of each of the second and fourth latch transistors (i.e., P4 and N4) may be coupled to the second differential output terminal Out−. The latch enable transistor P2 is preferably an enhancement mode PMOS loading type transistor, i.e., digital mode on/off type transistor. The latch enable transistor N2 is preferably an enhancement mode NMOS loading type transistor, i.e., digital mode on/off type transistor. The first and second latch transistors P3 and P4 are preferably each a PMOS type transistor. The third and fourth latch transistors N3 and N4 are preferably each an NMOS type transistor. It will be understood that other types of MOS transistors can be used without departing from the inventive concepts disclosed herein.

FIG. 4B is an example control signal circuit for generating control signals S2b and S2a used in connection with the sense amplifier circuit of FIG. 4A. The control signal circuit may receive a control signal S2, and may generate the control signals S2b and S2a using the control signal S2. The control signal S2b may be inverted relative to the control signal S2. The control signal S2a may correspond to the control signal S2. The control signal circuit of FIG. 4B may be included in the control logic 190 of the memory device 105 as illustrated in FIG. 2.

Figure 5:
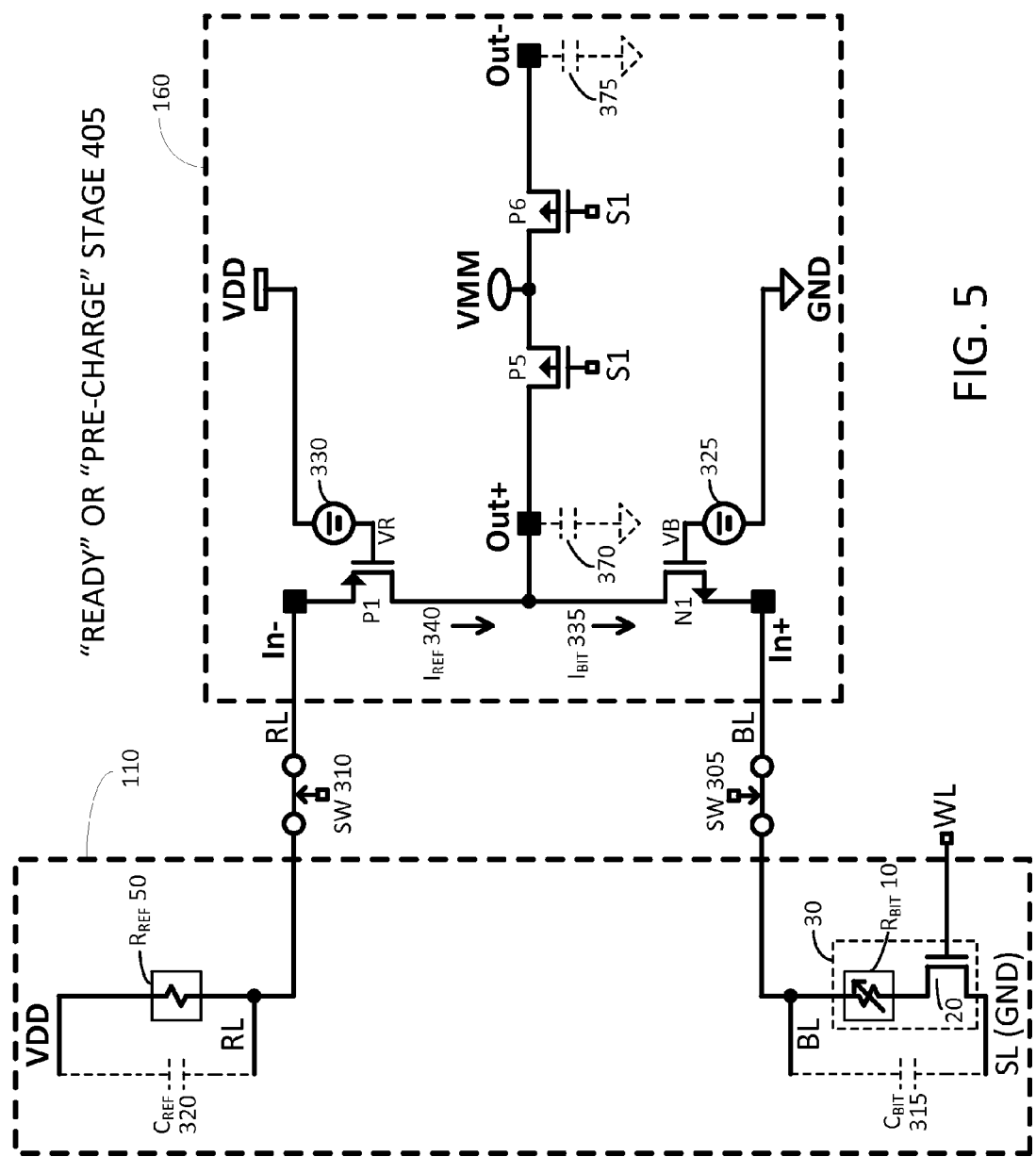
FIG. 5 is an example equivalent circuit diagram of the sense amplifier circuit of FIG. 4A associated with a "ready" or "pre-charge" stage of operation.
Figure 6:
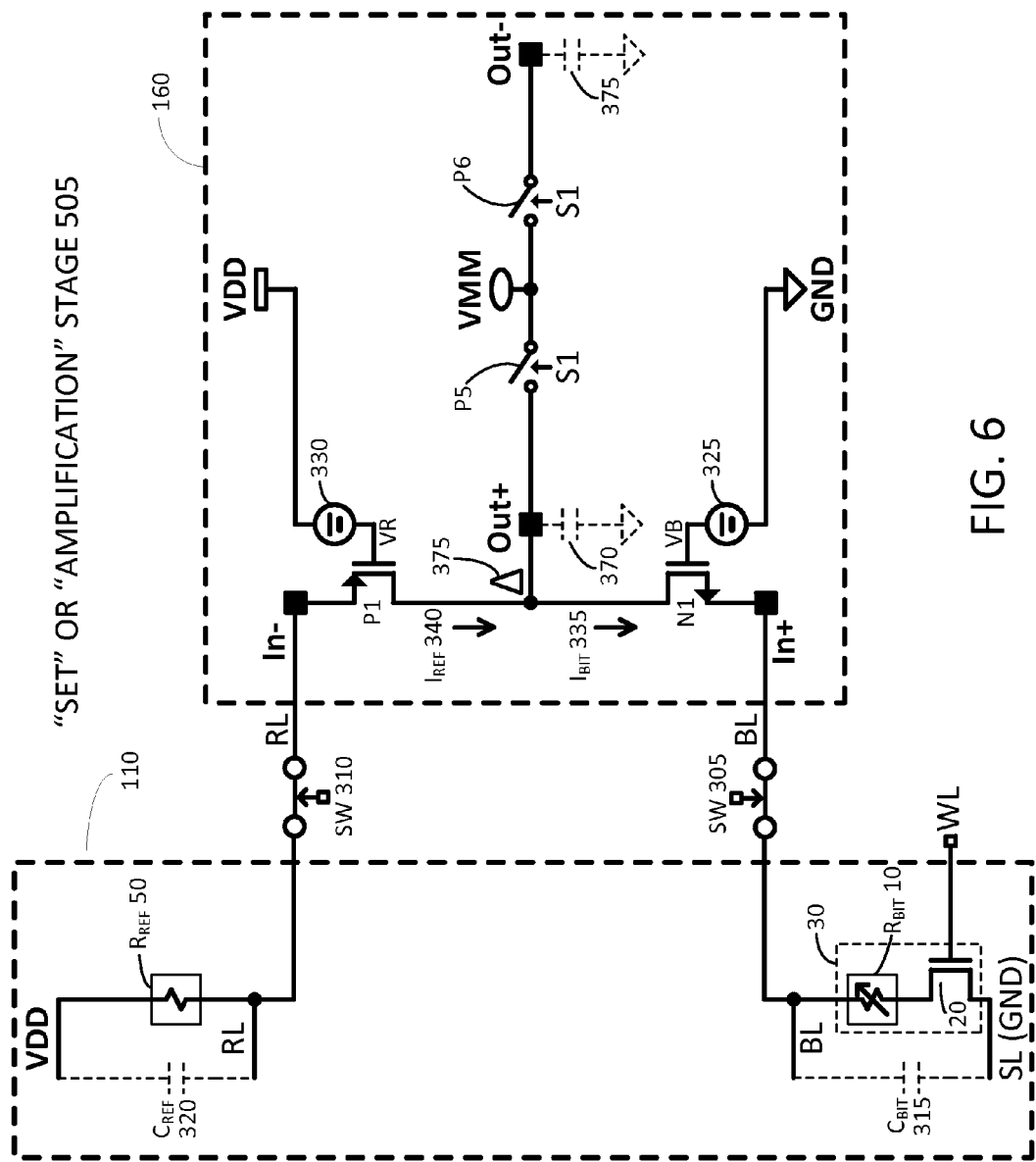
FIG. 6 is an example equivalent circuit diagram of the sense amplifier circuit of FIG. 4A associated with a "set" or "amplification" stage of operation.
Figure 7:
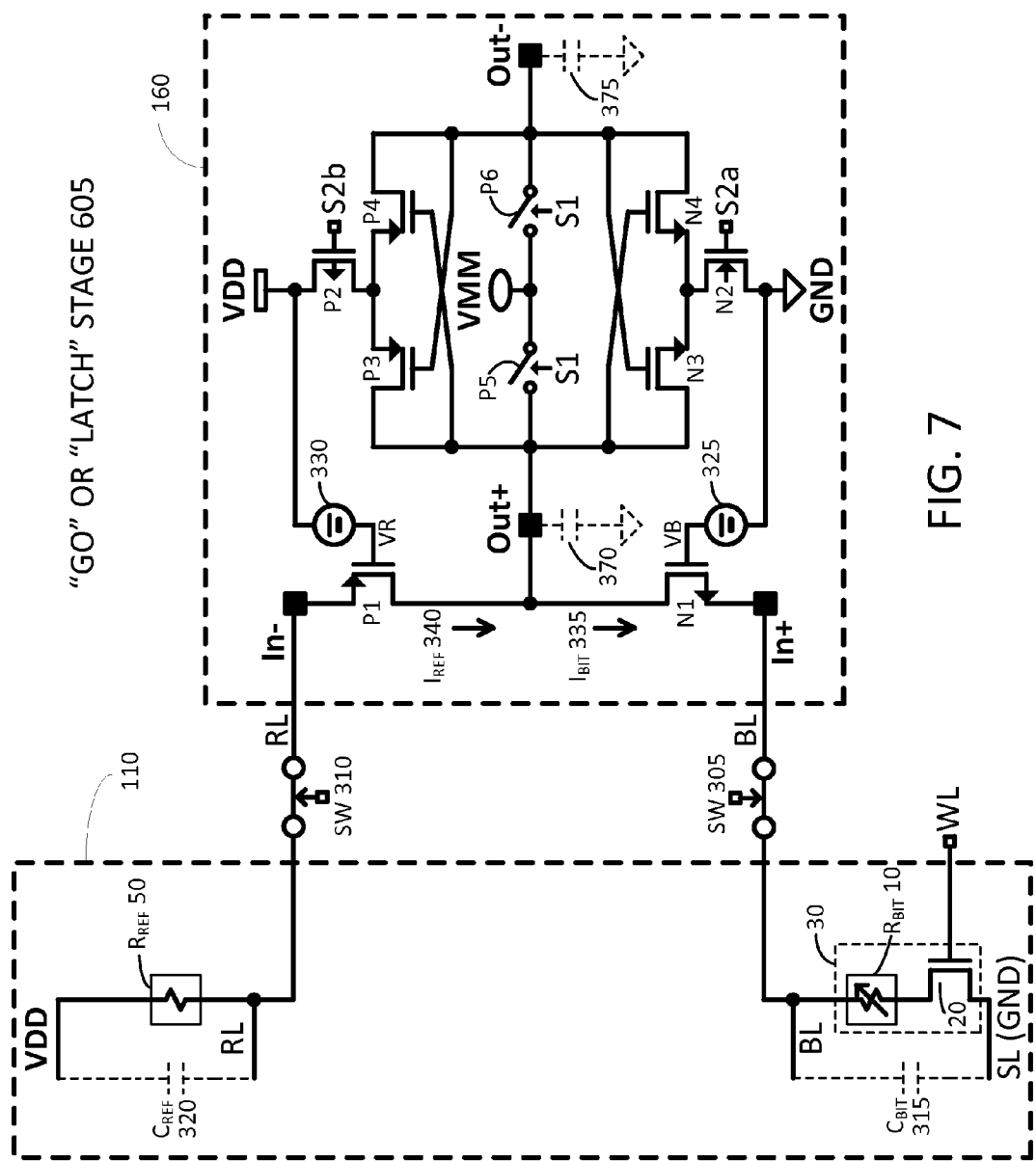
FIG. 7 is an example equivalent circuit diagram of the sense amplifier circuit of FIG. 4A associated with a "go" or "latch" stage of operation.
Figures 8, 9:
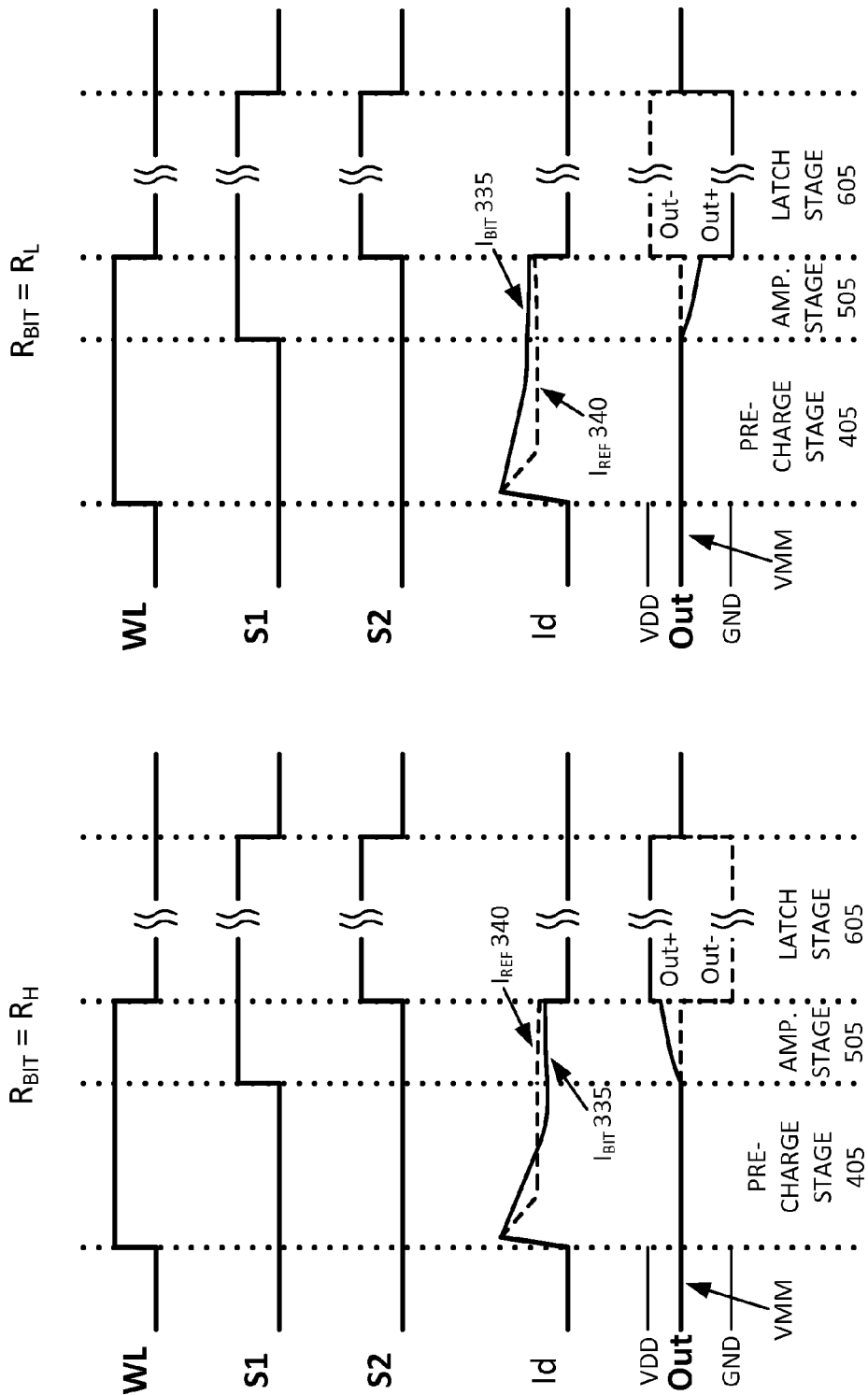
FIG. 8 is an example waveform diagram showing waveforms associated with different stages of the sense amplifier circuit of FIG. 4A when a memory cell resistance is previously set to high, in accordance with some embodiments of the inventive concept.
FIG. 9 is an example waveform diagram showing waveforms associated with different stages of the sense amplifier circuit of FIG. 4A when a memory cell resistance is previously set to low, in accordance with some embodiments of the inventive concept.

FIGS. 5-7 are example equivalent circuit diagrams illustrating various stages of operation of the sense amplifier circuit 160 of FIG. 4A. FIG. 8 is an example waveform diagram showing waveforms associated with different stages of the sense amplifier circuit 160 of FIG. 4A when a memory cell resistance $R_{BIT}$ is previously set to the "H" value $R_H$, in accordance with some embodiments of the inventive concept. FIG. 9 is an example waveform diagram showing waveforms associated with different stages of the sense amplifier circuit of FIG. 4A when a memory cell resistance $R_{BIT}$ is previously set to the "L" value $R_L$, in accordance with some embodiments of the inventive concept. The description proceeds with reference to aspects of FIGS. 5-9.

FIG. 5 is an example equivalent circuit diagram of the sense amplifier circuit 160 of FIG. 4A associated with the "ready" or "pre-charge" stage 405 of operation.

The switches SW 305 and SW 310 are assumed to be closed, thereby connecting the sense amplifier circuit 160 to the memory cell 30 and the reference resistor $R_{REF}$ 50. In the "ready" or "pre-charge" stage of the sense amplifier circuit 160, the word line WL transitions to a high ("H") state, the pre-charge control signal 51 is in a low ("L") state, and the latch enable signal S2 is in a "L" state. Because the latch enable signal S2 is in the "L" state, the latch enable control signal S2b is in the "H" state and the latch enable control signal S2a is in the "L" state.

The first pre-charge transistor P5 and the second pre-charge transistor P6 are thus fully turned on responsive to the pre-charge control signal S1 and form a conductive path to the intermediate power supply voltage node VMM. Therefore, the pre-charge transistor P5 generates at least a portion of the bit line current $I_{BIT}$ 335, which pre-charges at least the bit line BL and the bit line capacitor $C_{BIT}$ 315 associated with the memory cell 30, through the transistor N1, and a parasitic capacitance 370 associated with the first differential output terminal Out+. Moreover, the pre-charge transistor P5 generates at least a portion of the reference line current $I_{REF}$ 340, which pre-charges at least the reference line RL and the reference line capacitor $C_{REF}$ 320, through the transistor P1. The pre-charge transistor P6 pre-charges at least the parasitic capacitance 375 associated with the second differential output terminal Out−.

The transistors P1 and N1 are turned on responsive to the gate voltages VR and VB, respectively. The latch circuit, however, does not operate during this stage because the latch enable transistors P2 and N2 are turned off, and the other latch transistors are in a floating state or otherwise do not operate, and are therefore omitted from the equivalent circuit diagram of FIG. 5. Therefore, the pre-charge currents do not flow through any transistor of the latch circuit, thereby improving response times.

FIG. 6 is an example equivalent circuit diagram of the sense amplifier circuit 160 of FIG. 4A associated with the "set" or "amplification" stage 505 of operation. The switches SW 305 and SW 310 are assumed to be closed, thereby connecting the sense amplifier circuit 160 to the memory cell 30 and the reference resistor $R_{REF}$ 50. In the "set" or "amplification" stage of the sense amplifier circuit 160, the word line WL remains at the "H" state, the pre-charge control signal S1 transitions to the "H" state, and the latch enable signal S2 remains in the "L" state. The first pre-charge transistor P5 and the second pre-charge transistor P6 are thus turned off responsive to the pre-charge control signal S1, and are therefore shown as open switches in the equivalent circuit diagram of FIG. 6. In addition, the latch transistors do not operate because the latch enable transistors P2 and N2 are still off at this stage.

During the "set" or "amplification" stage 505, initially the voltage levels of the differential output terminals Out+ and Out− are the same, i.e., at VMM or thereabout. Then, as mentioned above, the delta average current 375 between the reference line current $I_{REF}$ 340 and the bit line current $I_{BIT}$ 335 causes the high-impedance output terminal Out+ to swing in one direction or the other, depending on the bit value stored in the memory cell 30. The voltage level of the second differential output terminal Out− remains at VMM, or thereabout, during this stage due to the parasitic capacitance 375.

If $I_{REF}$ 340 is greater than $I_{BIT}$ 335, then the voltage level of the high-impedance output terminal Out+ will swing higher, thereby indicating that a logical value "1" is stored in the memory cell 30. Conversely, if $I_{REF}$ 340 is less than $I_{BIT}$ 335, then the voltage level of the high-impedance output terminal Out+ will swing lower, thereby indicating that a logical value "0" is stored in the memory cell 30. At the end of the "set" or "amplification" stage, the difference between the output voltage levels of the output terminals Out+ and Out− is large enough to latch the output signal.

FIG. 7 is an example equivalent circuit diagram of the sense amplifier circuit of FIG. 4A associated with the "go" or "latch" stage 605. The switches SW 305 and SW 310 are assumed to be closed, thereby connecting the sense amplifier circuit 160 to the memory cell 30 and the reference memory cell 70. In the "go" or "latch" stage of the sense amplifier circuit 160, the word line WL transitions to the "L" state, the pre-charge control signal S1 remains at the "H" state, and the latch enable signal S2 transitions to the "H" state. Because the latch enable signal S2 transitions to the "H" state, the latch enable control signal S2b transitions to the "L" state, and the latch enable control signal S2a transitions to the "H" state. The first pre-charge transistor P5 and the second pre-charge transistor P6 remain turned off and are therefore represented in FIG. 7 as open switches. The latch enable transistors P2 and N2, and the latch transistors P3, P4, N3 and N4 are now able to operate responsive to the latch enable control signals S2b and S2a, respectively, which cause latch circuit to latch the output signals.

The full latch circuit (i.e., latch transistors P3, P4, N3, and N4) is used to latch a logical value "0" or logical value "1" at the differential output terminals based on the difference between the voltage level of the differential output terminal Out+ and the VMM voltage level of the differential output terminal Out−. Based on such voltage level difference, and based on positive feedback of the latch, the output values are latched.

It will be understood that the latch circuit will operate differently depending on whether a logical value "0" or "1" is stored in the memory cell 30. For example, if the memory cell is in a $R_L$ state (i.e., logical value "0"), then $I_{BIT}$ 335 is greater than $I_{REF}$ 340, which causes the voltage level of the output terminal Out+ to swing lower. Thus, in such case, the latch transistor P4 turns on, the latch transistor P3 turns off, the latch transistor N4 turns off, and the latch transistor N3 turns on, based on positive feedback, thereby latching a logical value "0" at the differential output terminal Out+. Conversely, if the memory cell is in a $R_H$ state (i.e., logical value "1"), then $I_{BIT}$ 335 is less than $I_{REF}$ 340, which causes the voltage level of the output terminal Out+ to swing higher. Thus, in such case, the latch transistor P4 turns off, the latch transistor P3 turns on, the latch transistor N4 turns on, and the latch transistor N3 turns off, based on positive feedback, thereby latching a logical value "1" at the differential output terminal Out+.

Figure 10:
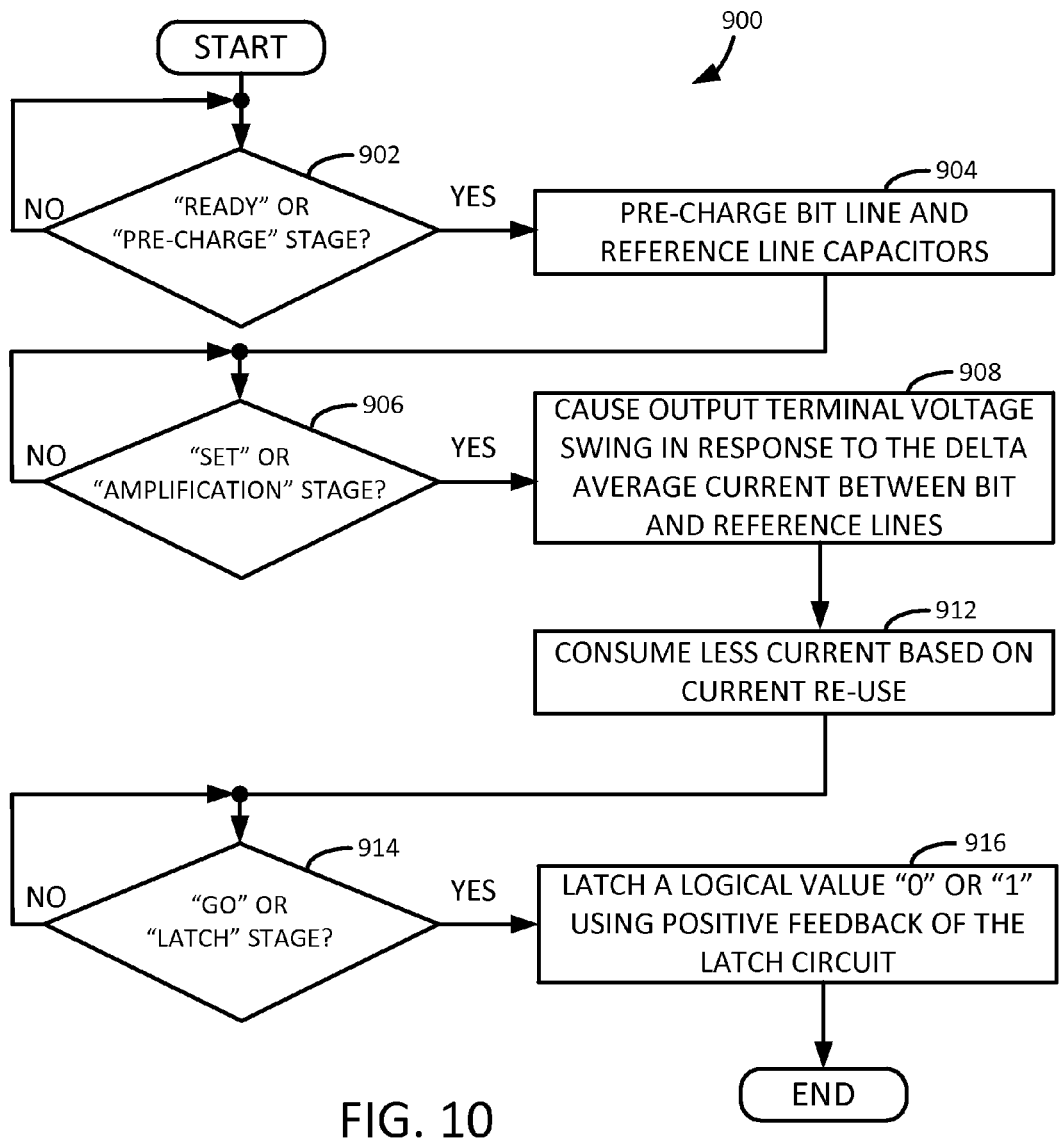
FIG. 10 is a flow diagram showing a technique for sensing data in a resistive type memory using a sense amplifier circuit, in accordance with some embodiments of the inventive concept.

FIG. 10 is a flow diagram 900 showing a technique for sensing data in the resistive type memory 30 using the sense amplifier circuit 160, in accordance with some embodiments of the inventive concept. The technique begins at 902, where a determination is made whether to enter the "ready" or "pre-charge" stage 405. If YES, the flow proceeds to 904 where the bit line and reference line capacitors are pre-charged, as described in detail above. Otherwise, if NO, the flow returns to the start.

At 906, another determination is made whether to enter the "set" or "amplification" stage 505. If YES, the flow proceeds to 908, and the voltage level of the output terminal Out+ is caused to swing one direction or another in response to the delta average current between the bit line current and the reference line current during the "set" or "amplification" stage. In addition, less current is consumed based on current re-use as further shown at 912, and as described in detail above, thereby improving current consumption characteristics of the sense amplifier circuit. Otherwise, if NO, the flow returns for further determinations and sense amplifier operations. The flow may repeat the stage 906.

Another determination is made at 914 whether to enter the "go" or "latch" stage of operation. If YES, the flow proceeds to 916, where a logical value of "0" or "1" is latched using positive feedback of the latch circuit, as also described in detail above. Otherwise, if NO, the flow may repeat the stage 914 or perform other determinations and sense amplifier operations.

FIG. 11A is an example circuit diagram of the sense amplifier (e.g., 160 and 165) of FIG. 2 associated with a current mirror 960, in accordance with another embodiment of the inventive concept. As previously mentioned, the sense amplifier circuitry 150 (of FIG. 2) may include multiple sense amplifier circuits. Each sense amplifier circuit can be associated with a corresponding bit line and a corresponding memory cell of at least one of the memory blocks (e.g., 120 and 130 of FIG. 2). The current mirror circuit 960 is coupled to the multiple sense amplifiers (e.g., 160, 165, etc.). The current mirror circuit 960 mirrors the reference line current $I_{REF}$ 340 during at least during the "set" or "amplification" stage of each of the sense amplifier circuits. The bit line BL of each of the sense amplifier circuits re-uses at least some of the mirrored reference line current.

Each of the plurality of sense amplifier circuits can include a high-impedance output terminal coupled to the corresponding bit line and the corresponding memory cell, as mentioned above. The corresponding bit line is configured to conduct a bit line current $I_{BIT}$ 335. A voltage level of the high-impedance output terminal swings responsive to the delta average current 375 between the mirrored reference line current and the bit line current.

Each of the sense amplifier circuits (e.g., 160, 165, etc.) includes a latch circuit (e.g., P3, P4, N3, and N4) as described in detail above. The memory device 105 further includes a first global latch enable transistor P2 and a second global latch enable transistor N2 that are configured to enable a latch stage for each of the sense amplifier circuits responsive to the latch control signals S2b and S2a, respectively.

The current mirror circuit 960 includes current mirror transistors P0 and N0. The gate of the transistor P1 is coupled to the gate of the mirror transistor P0. The voltage source 935 provides gate voltage VR to the gate of the mirror transistor N0. The mirror transistors are operable to mirror the $I_{REF}$ 340 current for each of the multiple sense amplifier circuits.

The current mirror circuit 960 is coupled to a reference line RL associated with the reference memory cell 70. The current mirror circuit 960 pre-charges the reference line RL associated with the reference memory cell 70 during a pre-charge stage of each of the sense amplifier circuits. The current mirror circuit 960 mirrors the reference line current $I_{REF}$ 340 during at least an amplification stage of each of the sense amplifier circuits. In addition, the current mirror circuit 960 is configured to pre-charge the reference line RL associated with the reference memory cell 70. Because the reference memory cell 70 includes both a select transistor 60 and the reference resistor $R_{REF}$ 50, there is a better match with the memory cell 30, thereby improving the matching sensitivity. As a result, the difference between the $I_{REF}$ and $I_{BIT}$ currents is primarily from the difference between the resistances $R_{REF}$ and $R_{BIT}$. The other components and modes of operation are otherwise similar to those described above, and therefore are omitted here for the sake of brevity.

The example control signal circuit of FIG. 11B is the same as that of FIG. 4B, and generates latch enable control signals for the example circuit of FIG. 11A. Therefore, a detailed description of FIG. 11B is omitted.

FIG. 12A is an example circuit diagram of a sense amplifier circuit 970 including read/re-write capability, in accordance with yet another embodiment of the inventive concept. The sense amplifier 970 is similar to the sense amplifier 160 of FIGS. 2 and 4A, and therefore, a detailed description of the same or similar components is omitted for the sake of brevity. FIG. 13A is an example waveform diagram showing waveforms associated with different stages of the sense amplifier circuit of FIG. 12A when a memory cell resistance is previously set to high, in accordance with some embodiments of the inventive concept. FIG. 13B is an example waveform diagram showing waveforms associated with different stages of the sense amplifier circuit of FIG. 12A when a memory cell resistance is previously set to low, in accordance with some embodiments of the inventive concept. Reference is now made to FIGS. 12A, 13A, and 13B.

There are a few structural differences relative to the sense amplifier circuits described above. Specifically, the sense amplifier circuit 970 does not include the transistor N1. In addition, rather than a ground voltage node GND, a negative power supply voltage node VSS is coupled to the latch enable transistor N2. For example, if the positive power supply voltage node VDD provides a voltage level of 1.2 V, then the negative power supply voltage node VSS can provide a voltage level of −1.2 V. Moreover, the output and input terminals are combined as input/output (IO) terminals IO+ and IO−.

Pertaining to operational characteristics, the various stages of operation are similar to those described above, although with the added feature of read/re-write capability. One notable difference is that the voltage swing of the IO+ terminal during the amplification stage is determined not by a delta average current, but rather, it is determined directly by the reference current $I_{REF}$ 340 multiplied by the total bit resistance (e.g., $I_{REF}$ 340 multiplied by $R_{BIT}$ 10). In the absence of an active device on the bit line such as the N1 transistor, there is a direct path between the IO+ terminal and the memory cell 30. In this embodiment, the parasitic capacitance 370 is essentially merged with the bit capacitor $C_{BIT}$ 315 (which has a capacitance that is, for example, up to 10× times greater than the parasitic capacitance 370), and together increase the settling time of the voltage level at the IO+ terminal, thereby dampening any spikes or other possible noise interference. In other words, the voltage level of the IO+ terminal is essentially determined by the reference current $I_{REF}$ 340 and an RC circuit.

By way of example, if the $R_{BIT}=R_L$, then the IO+ terminal is pulled down to a value less than VMM during the amplification stage, and to the VSS voltage level during the latch stage, which re-writes the memory resistor $R_{BIT}$ 10 to clearly a value of $R_L$. Conversely, if the $R_{BIT}=R_H$, then the IO+ terminal is pulled up to a value greater than VMM during the amplification stage, and to the VDD voltage level during the latch stage, which re-writes the memory resistor $R_{BIT}$ 10 to clearly a value of $R_H$. Without the re-write operation, it is possible that the $R_{BIT}$ inadvertently flips. To avoid such disturbance, by re-writing after every read operation, there is a higher probability that the value stored in the $R_{BIT}$ will remain the proper and expected value.

The example control signal circuit of FIG. 12B is the same as that of FIG. 4B, and generates latch enable control signals for the example circuit of FIG. 12A. Therefore, a detailed description of FIG. 11B is omitted.

Figures 14A, 14B:
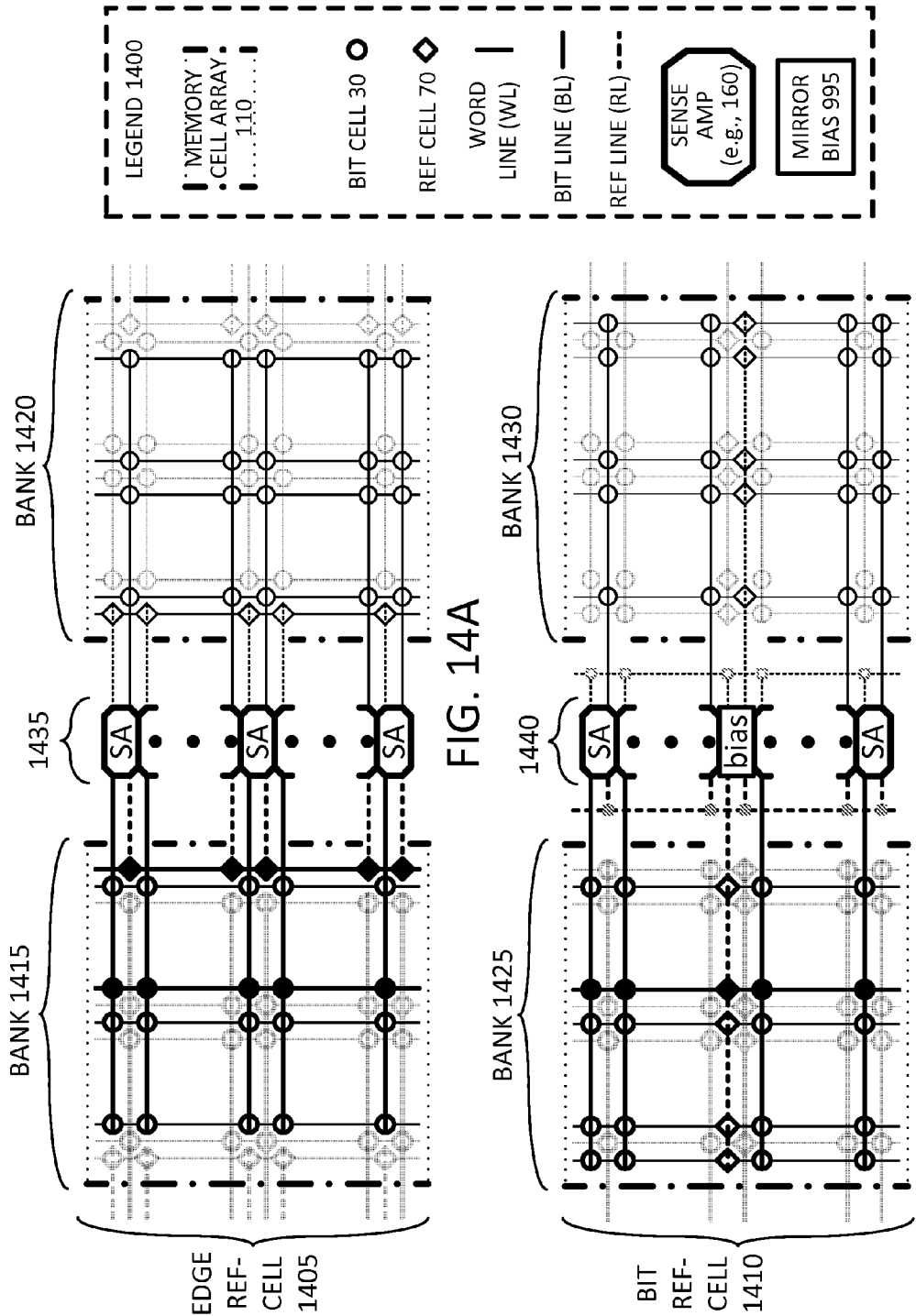
FIG. 14A is an example diagram of a layout of the memory cell array and associated memory banks in an edge-reference cell arrangement or pattern, in accordance with another embodiment of the inventive concept.
FIG. 14B is an example diagram of a layout of the memory cell array and associated memory banks in a bit-reference cell arrangement or pattern, in accordance with another embodiment of the inventive concept.

FIG. 14A is an example diagram of a layout of the memory cell array (e.g., 110) and associated memory banks (e.g., 1415 and 1420) in an edge-reference cell arrangement or pattern (e.g., 1405), in accordance with another embodiment of the inventive concept. Legend 1400 provides a description of the symbols used in the arrangement. Referring to FIG. 14A, the shared sense amplifiers 1435 are used by either or both memory banks 1415 and 1420. The reference memory cells 70 can be disposed adjacent to or near to the shared sense amplifiers 1435. A particular reference memory cell 70 can provide a reference for multiple memory bit cells 30 in bank 1415 and/or bank 1420.

A reference memory cell 70 from memory bank 1415 and a reference cell 70 from memory bank 1420 can be coupled to a shared sense amplifier (e.g., from among the sense amplifiers 1435) over corresponding reference lines. In other words, a shared sense amplifier can be coupled to two or more reference lines and/or reference memory cells from different banks. Similarly, a memory bit cell 30 from memory bank 1415 and a memory bit cell 30 from memory bank 1420 can be coupled to a shared sense amplifier (e.g., from among the sense amplifiers 1435) over corresponding bit lines. In other words, a single shared sense amplifier can be coupled to two or more bit lines and/or memory bit cells from different banks.

FIG. 14B is an example diagram of a layout of the memory cell array (e.g., 110) and associated memory banks (e.g., 1425 and 1430) in a bit-reference cell arrangement or pattern (e.g., 1410), in accordance with another embodiment of the inventive concept. As with FIG. 14A, legend 1400 provides a description of the symbols used in this arrangement. Referring to FIG. 14B, the shared sense amplifiers 1440 are used by either or both memory banks 1425 and 1430. In this layout, memory bit cells 30 can be disposed adjacent to the reference memory cells 70.

A common reference line in one bank can connect multiple reference memory cells 70 to a mirror bias circuit 995 and/or to multiple sense amplifier circuits. A reference memory cell of the bank 1425 can be coupled to the mirror bias circuit 995 via a first common reference line. A reference memory cell of the bank 1430 can be coupled to the same mirror bias circuit 995 via a second common reference line. A memory cell of the first bank 1425 can be coupled to a given shared sense amplifier circuit and a different memory cell of the second bank 1430 can be coupled to the given shared sense amplifier circuit. The mirror bias circuit 995 can be disposed adjacent to the shared sense amplifier circuit(s).

A reference memory cell 70 from memory bank 1430 and a memory bit cell 30 from memory bank 1425 can be coupled to a shared sense amplifier (e.g., from among the sense amplifiers 1440) over a corresponding common reference line and individual bit line, respectively. In other words, a shared sense amplifier can be coupled to a common reference line and an individual bit line that are associated with different banks. Similarly, a shared sense amplifier can be coupled to a reference cell 70 and a memory bit cell 30 that are associated with different banks. In other words, a single shared sense amplifier can be coupled to reference cells and/or memory bit cells from different banks.

Referring to FIGS. 4 through 14B described above, in some embodiments, the source lines SLs are tied to a ground GND potential, and this is the configuration that is assumed for the circuit diagram illustrated in FIGS. 4 through 14B. It will be understood, however, that in some embodiments (for any of the circuit diagrams described with reference to FIGS. 4 through 11B), the source lines SLs can be tied to a power supply VDD potential, and the regular VDD potential can be tied to the ground GND potential. In such case, each PMOS type transistor is replaced with an NMOS type transistor, and each NMOS transistor is replaced with a PMOS type transistor. In other words, where the source lines SLs are tied to the VDD potential, the sense amplifier is swapped between the upside and the downside, which means that the NMOS type transistors are replaced with PMOS transistors, and the PMOS transistors are replaced with NMOS transistors. Put differently, when the source line is coupled to the ground voltage, the sense amplifier circuit includes a first transistor configuration, and when the source line is coupled to the power supply voltage, the sense amplifier circuit includes a second transistor configuration that is swapped relative to the first transistor configuration. It will also be understood that in some embodiments, for example, with reference to FIGS. 12A and 12B, the source lines SLs can remain tied to the ground GND potential, the negative power supply voltage node VSS can be replaced with the power supply voltage node VDD, the regular VDD potential can be tied to the ground GND potential, and the NMOS and PMOS transistors can be swapped as described above.

Figure 15:
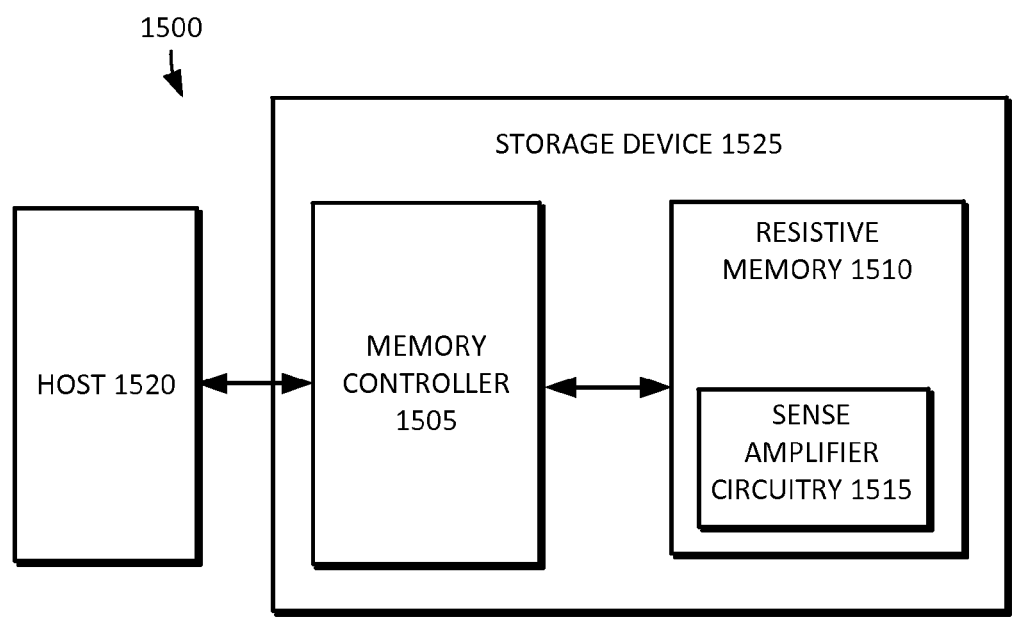
FIG. 15 is a block diagram schematically illustrating various applications of a resistive memory device, according to an embodiment of the inventive concept.

FIG. 15 is a block diagram schematically illustrating various applications of a resistive memory device, according to an embodiment of the inventive concept. Referring to FIG. 15, a memory system 1500 may include a storage device 1525 and a host 1520. The storage device 1525 may include a resistive memory 1510 and a memory controller 1505.

The storage device 1525 may include a storage medium such as a memory card (e.g., SD, MMC, etc.) or an attachable handheld storage device (e.g., USB memory, etc.). The storage device 1525 may be connected to the host 1520. The storage device 1525 may transmit and receive data to and from the host 1520 via a host interface. The storage device 1525 may be powered by the host 1520 to execute an internal operation. The resistive memory 1510 may include sense amplifier circuitry 1515 according to an embodiment of the inventive concept.

Figure 16:
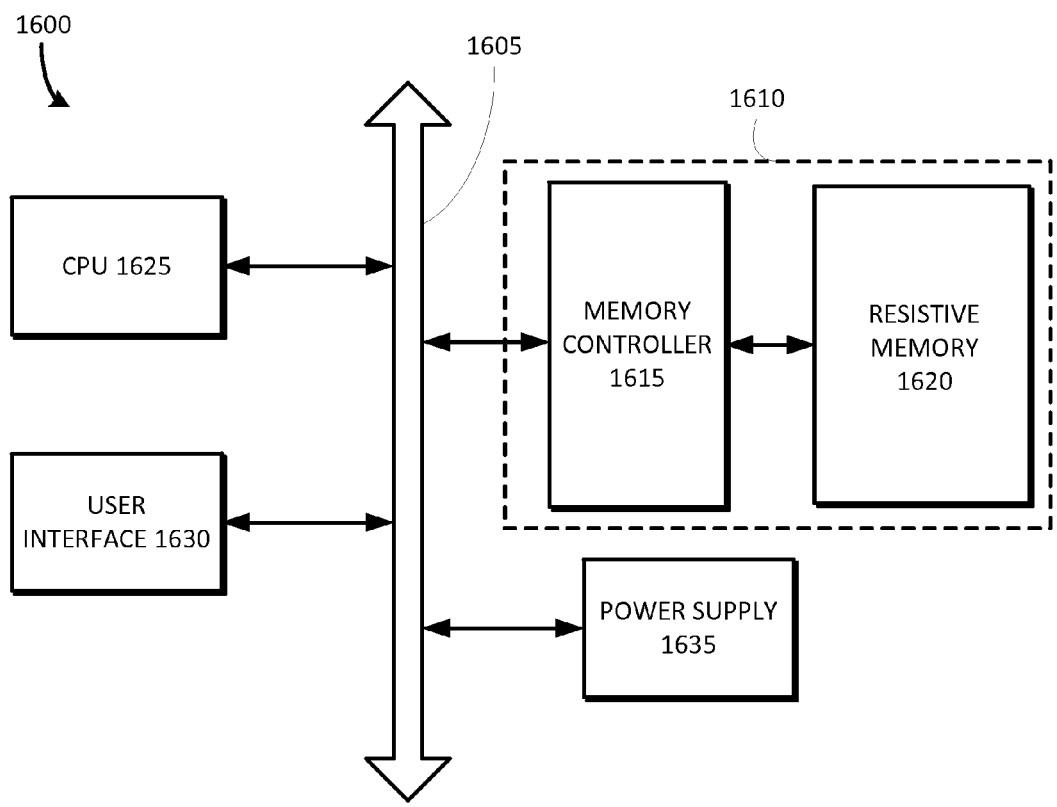
FIG. 16 is a block diagram of a computing system, including a resistive memory device, according to an embodiment of the inventive concept.

FIG. 16 is a block diagram of a computing system 1600, including a resistive memory device, according to an embodiment of the inventive concept. Referring to FIG. 16, the computing system 1600 includes a memory system 1610, a power supply 1635, a central processing unit (CPU) 1625, and a user interface 1630. The memory system 1610 includes a resistive memory device 1620 and a memory controller 1615. The CPU 1625 is electrically connected to a system bus 1605.

The resistive memory device 1620 may include sense amplifier circuitry according to an embodiment of the inventive concept. The resistive memory device 1620 stores data through the memory controller 1615. The data is received from the user interface 1630 or processed by the CPU 1625. The memory system 1600 may be used as a semiconductor disc device (SSD).

Figure 17:
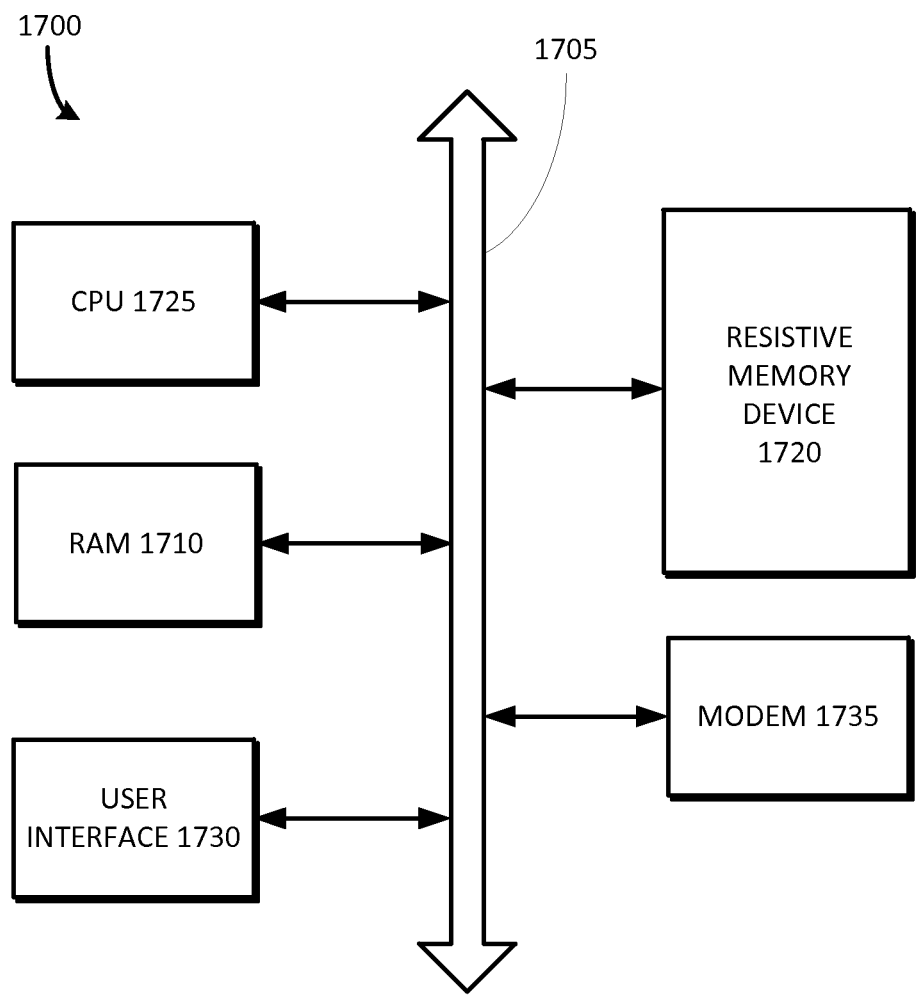
FIG. 17 is a block diagram schematically illustrating a computing system, including a resistive memory device, according to an embodiment of the inventive concept.

FIG. 17 is a block diagram schematically illustrating a computing system 1700, including a resistive memory device, according to an embodiment of the inventive concept. Referring to FIG. 17, the computing system 1700 may include a resistive memory device 1720, a CPU 1725, a RAM 1710, a user interface 1730, and a modem 1735 such as a baseband chipset, which are electrically connected to a system bus 1705. The resistive memory device 1720, as described above, may include sense amplifier circuitry according to an embodiment of the inventive concept.

If the computing system 1700 is a mobile device, it may further include a battery (not shown) which powers the computing system 1700. Although not shown in FIG. 17, the computing system 1700 may further include an application chipset, a camera image processor (CIS), a mobile DRAM, and the like.

A resistive memory device according to an embodiment of the inventive concept may be used as a storage class memory (SCM). The "storage class memory" may be the generic term for a memory which provides both the nonvolatile characteristic and random-access characteristic.

The above described PRAM, FeRAM, MRAM, and the like as well as the resistive memory (ReRAM) may be used as the storage class memory. Instead of a flash memory, the storage class memory may be used as a data storage memory. Further, instead of a synchronous DRAM, the storage class memory may be used as a main memory. Further, one storage class memory may be used instead of a flash memory and a synchronous DRAM.

Figure 18:
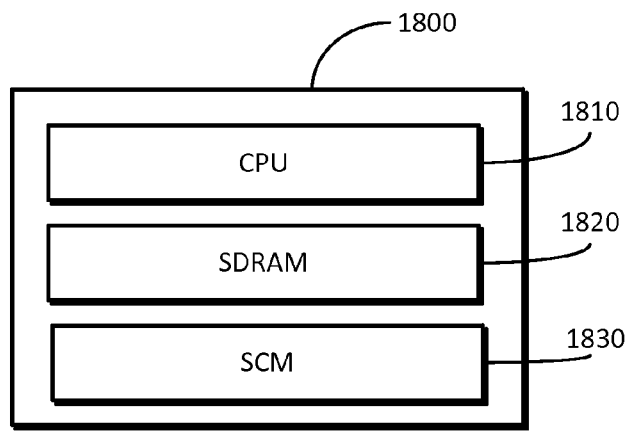
FIG. 18 is a block diagram schematically illustrating a memory system in which a flash memory is replaced with a storage class memory using a resistive memory, according to an embodiment of the inventive concept.

FIG. 18 is a block diagram schematically illustrating a memory system in which a flash memory is replaced with a storage class memory using a resistive memory, according to an embodiment of the inventive concept. Referring to FIG. 18, a memory system 1800 may include a CPU 1810, a synchronous DRAM (SDRAM) 1820, and a storage class memory (SCM) 1830. The SCM 1830 may be a resistive memory that is used as a data storage memory instead of a flash memory.

The SCM 1830 may access data in higher speed compared with a flash memory. For example, in a PC in which the CPU 1810 operates at a frequency of 4 GHz, a resistive memory being a type of SCM 1830 may provide an access speed higher than a flash memory. Thus, the memory system 1800 including the SCM 1830 may provide a relatively higher access speed than a memory system including a flash memory.

Figure 19:
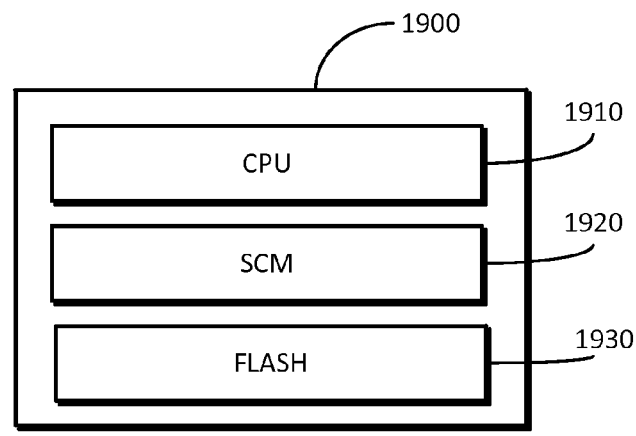
FIG. 19 is a block diagram schematically illustrating a memory system in which a synchronous DRAM is replaced with a storage class memory using a resistive memory, according to an embodiment of the inventive concept.

FIG. 19 is a block diagram schematically illustrating a memory system in which a synchronous DRAM is replaced with a storage class memory using a resistive memory, according to an embodiment of the inventive concept. Referring to FIG. 19, a memory system 1900 may include a CPU 1910, a storage class memory (SCM) 1920, and a flash memory 1930. The SCM 1920 may be used as a main memory instead of a synchronous DRAM (SDRAM).

Power consumed by the SCM 1920 may be less than that consumed by the SDRAM. A main memory may take about 40% of a power consumed by a computing system. For this reason, a technique of reducing power consumption of a main memory has been developed. Compared with the DRAM, the SCM 1920 may on average reduce 53% of dynamic energy consumption and about 73% of energy consumption due to power leak. Thus, the memory system 1900 including the SCM 1920 may reduce power consumption compared with a memory system including an SDRAM.

Figure 20:
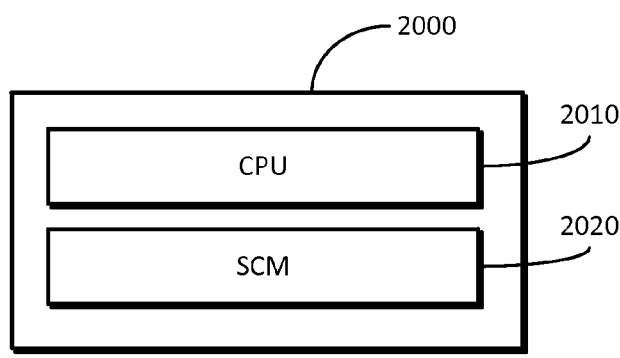
FIG. 20 is a block diagram schematically illustrating a memory system in which a synchronous DRAM and a flash memory are replaced with a storage class memory using a resistive memory according to an embodiment of the inventive concept.

FIG. 20 is a block diagram schematically illustrating a memory system in which a synchronous DRAM and a flash memory are replaced with a storage class memory using a resistive memory according to an embodiment of the inventive concept. Referring to FIG. 20, a memory system 2000 may include a CPU 2010 and a storage class memory (SCM) 2020. The SCM 2020 may be used as a main memory instead of a synchronous DRAM (SDRAM) and as a data storage memory instead of a flash memory. The memory system 2000 may be advantageous in the light of data access speed, low power, cost, and use of space.

A resistive memory device according to the inventive concept may be packed by at least one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

A resistive memory device according to an embodiment of the inventive concept may be applied to various products. The resistive memory device according to an embodiment of the inventive concept may be applied to storage devices such as a memory card, a USB memory, a solid state drive (SSD), and the like, as well as to electronic devices such as a personal computer, a digital camera, a camcorder, a cellular phone, an MP3 player, a PMP, a PSP, a PDA, and the like.

The example embodiments disclosed herein provide a sense amplifier circuit capable of using a lower power supply voltage. In addition, the sense amplifier circuit embodiments disclosed herein provide faster read response times, less sensitivity on the parasitic difference between bit lines and reference lines, strong noise immunity by keeping signal average, and additional configurations using self-latching logic. It will be understood that different features from different embodiments can be combined in the same sense amplifier circuit.

The above embodiments of the inventive concept are illustrative and not limitative. Various alternatives and equivalents are possible. The embodiments of the inventive concept are not limited by the type or the number of the magnetic random access memory cells included in a memory array. The embodiments of the inventive concept are not limited by the type of transistor, PMOS, NMOS or otherwise, included to operate the sense amplifier circuit, select a magnetic tunnel junction device, or the like. The embodiments of the inventive concept are not limited by the type of logic gates, NOR or NAND included to implement logical column selection or to produce control logic for the sense amplifier circuit. The embodiments of the inventive concept are not limited by the type of integrated circuit in which the inventive concept may be disposed. Nor are the embodiments of the inventive concept limited to any specific type of process technology, e.g., CMOS, Bipolar, or BICMOS that may be included to manufacture a memory. The embodiments described herein have been directed to sense amplifier circuits but are not limited thereto. The embodiments described herein may be included wherever improving response times, noise immunity characteristics, low voltage operation capabilities, larger voltage headroom features, or fewer sense errors, or the like, may be found useful.

Other similar or non-similar modifications can be made without deviating from the intended scope of the inventive concept. Accordingly, the inventive concept is not limited except as by the appended claims.

What is claimed is:

1. A resistive type memory sense amplifier circuit, comprising:
   a first differential output terminal configured to output a first output signal;
   a second differential output terminal configured to output a second output signal opposite the first output signal;
   a first input terminal coupled to a bit line associated with a resistive type memory cell;
   a second input terminal coupled to a reference line associated with a reference memory cell;
   a first transistor coupled to the second input terminal and to the first differential output terminal, the first transistor being configured to conduct a reference line current;
   a second transistor coupled to the first differential output terminal and arranged in series with the first transistor, the second transistor being configured to conduct a bit line current;
   a pre-charge section coupled to an intermediate power supply voltage node, the intermediate power supply voltage node having a voltage level between a power supply voltage and a ground voltage, the pre-charge section including:
   a first pre-charge transistor coupled to the first differential output terminal and to the intermediate power supply voltage node; and
   a second pre-charge transistor coupled to the second differential output terminal and the intermediate power supply voltage node,
   wherein the pre-charge section is configured to operate during a pre-charge stage of the sense amplifier circuit, and
   wherein a voltage level of the first differential output terminal is configured to swing responsive to a delta average current between the reference line current and the bit line current.

2. The resistive type memory sense amplifier circuit of claim 1, wherein the bit line is configured to re-use at least some of the reference line current associated with the reference line.

3. The resistive type memory sense amplifier circuit of claim 1, wherein:

a drain of the second transistor is directly coupled to the first differential output terminal and to a drain of the first transistor;

a source of the second transistor is coupled to the bit line associated with the memory cell;

the first differential output terminal comprises a high-impedance output terminal; and the voltage level of the high-impedance output terminal is configured to swing responsive to an amplification stage of the sense amplifier circuit.

4. The resistive type memory sense amplifier circuit of claim 1, wherein:

the first pre-charge transistor is configured to receive a pre-charge control signal and to pre-charge at least the bit line associated with the memory cell and the reference line during the pre-charge stage of the sense amplifier circuit responsive to the pre-charge control signal; and the second pre-charge transistor is configured to receive the pre-charge control signal and to pre-charge at least a parasitic capacitance associated with the second differential output terminal during the pre-charge stage of the sense amplifier circuit responsive to the pre-charge control signal.

5. The resistive type memory sense amplifier circuit of claim 1, further comprising a cross-coupled latch circuit coupled to the first and second differential output terminals, wherein the cross-coupled latch circuit comprises:

a first latch enable transistor coupled to a power supply voltage node and configured to enable a latch stage of the sense amplifier circuit responsive to a first latch control signal;

a first latch transistor coupled to the first latch enable transistor and to the first differential output terminal;

a second latch transistor coupled to the first latch enable transistor and to the second differential output terminal;

a second latch enable transistor coupled to a ground voltage node and configured to enable the latch stage of the sense amplifier circuit responsive to a second latch control signal;

a third latch transistor coupled to the second latch enable transistor and to the first differential output terminal; and a fourth latch transistor coupled to the second latch enable transistor and to the second differential output terminal, wherein the latch transistors are configured to latch, based on positive feedback, a logical value "0" or logical value "1" at the first or second differential output terminals, respectively, depending on a bit value stored in the resistive type memory cell, and responsive to the first and second latch enable transistors being turned on by the first and second latch control signals, respectively, during the latch stage.

6. The resistive type memory sense amplifier circuit of claim 5, wherein:

the first latch enable transistor is a PMOS type transistor;
the second latch enable transistor is an NMOS type transistor;
the first and second latch transistors are each a PMOS type transistor; and
the third and fourth latch transistors are each an NMOS type transistor.

7. The resistive type memory sense amplifier circuit of claim 5, wherein:

a source of the first latch transistor is directly coupled to a drain of the first latch enable transistor;
a source of the second latch transistor is directly coupled to a drain of the first latch enable transistor;

a source of the third latch transistor is directly coupled to a drain of the second latch enable transistor; and
a source of the fourth latch transistor is directly coupled to the drain of the second latch enable transistor.

8. The resistive type memory sense amplifier circuit of claim 5, wherein:

a gate of the first latch transistor is coupled to the second differential output terminal;
a gate of the second latch transistor is coupled to the first differential output terminal;
a gate of the third latch transistor is coupled to the second differential output terminal; and
a gate of the fourth latch transistor is coupled to the first differential output terminal.

9. The resistive type memory sense amplifier circuit of claim 5, wherein:

a drain of each of the first and third latch transistors is coupled to the first differential output terminal; and
a drain of each of the second and fourth latch transistors is coupled to the second differential output terminal.

10. The resistive type memory sense amplifier circuit of claim 1, wherein the resistive type memory cell includes at least one of a spin transfer torque (STT) magnetoresistive random-access memory (MRAM) cell, an MRAM cell, a memristor RAM cell, an ReRAM cell, or a CBRAM cell.

11. The resistive type memory sense amplifier circuit of claim 1, wherein the resistive type memory cell is a spin transfer torque (STT) magnetoresistive random-access memory (MRAM) cell.

12. The resistive type memory sense amplifier circuit of claim 1, further comprising a source line coupled to the memory cell, wherein:

the source line is coupled to one of a power supply voltage node or a ground voltage node;
when the source line is coupled to the ground voltage node, the sense amplifier circuit includes a first transistor configuration; and
when the source line is coupled to the power supply voltage node, the sense amplifier circuit includes a second transistor configuration that is swapped relative to the first transistor configuration.

13. A resistive type memory sense amplifier circuit, comprising:

a first differential output terminal configured to output a first output signal;
a second differential output terminal configured to output a second output signal opposite the first output signal;
a first input terminal coupled to a bit line associated with a resistive type memory cell;
a second input terminal coupled to a reference line associated with a reference memory cell;
a first transistor coupled to the second input terminal and to the first differential output terminal, the first transistor being configured to conduct a reference line current;
a second transistor coupled to the first differential output terminal and arranged in series with the first transistor, the second transistor being configured to conduct a bit line current; and
wherein a voltage level of the first differential output terminal is configured to swing responsive to a delta average current between the reference line current and the bit line current, wherein:
the first transistor is a PMOS type transistor; and
the second transistor is an NMOS type transistor.

14. The resistive type memory sense amplifier circuit of claim 13, wherein the bit line is configured to re-use at least some of the reference line current associated with the reference line.

15. The resistive type memory sense amplifier circuit of claim 13, wherein:
   a drain of the second transistor is directly coupled to the first differential output terminal and to a drain of the first transistor;
   a source of the second transistor is coupled to the bit line associated with the memory cell;
   the first differential output terminal comprises a high-impedance output terminal; and
   the voltage level of the high-impedance output terminal is configured to swing responsive to an amplification stage of the sense amplifier circuit.

16. The resistive type memory sense amplifier circuit of claim 13, further comprising a pre-charge section coupled to an intermediate power supply voltage node, the intermediate power supply voltage node having a voltage level between a power supply voltage and a ground voltage, the pre-charge section including:
   a first pre-charge transistor coupled to the first differential output terminal and to the intermediate power supply voltage node; and
   a second pre-charge transistor coupled to the second differential output terminal and the intermediate power supply voltage node,
   wherein the pre-charge section is configured to operate during a pre-charge stage of the sense amplifier circuit.

17. The resistive type memory sense amplifier circuit of claim 13, wherein the resistive type memory cell includes at least one of a spin transfer torque (STT) magnetoresistive random-access memory (MRAM) cell, an MRAM cell, a memristor RAM cell, an ReRAM cell, or a CBRAM cell.

18. The resistive type memory sense amplifier circuit of claim 13, wherein the resistive type memory cell is a spin transfer torque (STT) magnetoresistive random-access memory (MRAM) cell.

19. The resistive type memory sense amplifier circuit of claim 13, further comprising a source line coupled to the memory cell, wherein:
   the source line is coupled to one of a power supply voltage node or a ground voltage node;
   when the source line is coupled to the ground voltage node, the sense amplifier circuit includes a first transistor configuration; and
   when the source line is coupled to the power supply voltage node, the sense amplifier circuit includes a second transistor configuration that is swapped relative to the first transistor configuration.

20. A method for sensing bit information stored in a resistive type memory, the method comprising:
   in a pre-charge stage of a sense amplifier circuit, pre-charging, by a pre-charge section, at least a bit line and a reference line;
   in an amplification stage of the sense amplifier circuit, causing a reference line current to flow through the reference line and a bit line current to flow through the bit line;
   in the amplification stage of the sense amplifier circuit, causing a voltage swing at a first differential output terminal responsive to a delta average current between the reference line current and the bit line current; and
   in a latch stage of the sense amplifier circuit, latching, by a latch circuit, a logical value "0" or logical value "1" at the first differential output terminal or a second differential output terminal, respectively, using positive feedback of the latch circuit.

21. The method of claim 20, wherein causing the bit line current to flow through the bit line includes re-using at least some of the reference line current flowing through the reference line.

22. The method of claim 20, wherein:
   the first differential output terminal comprises a high-impedance output terminal; and
   causing the voltage swing at the high-impedance output terminal includes multiplying, by the delta average current, a parasitic impedance associated with the high-impedance output terminal.

23. The method of claim 20, wherein:
   pre-charging, by the pre-charge section, includes pre-charging at least the bit line and the reference line using an intermediate power supply voltage node having a voltage level between a power supply voltage and a ground voltage.

24. A resistive type memory sense amplifier circuit, comprising:
   a first input/output terminal configured to output a first output signal, the first input/output terminal being coupled to a reference line associated with a reference memory cell and to a bit line associated with a resistive type memory cell, the reference line and the bit line being configured to conduct a reference line current;
   a second input/output terminal configured to output a second output signal opposite the first output signal;
   a transistor coupled to the first input/output terminal and to the reference line, the transistor being configured to conduct the reference line current; and
   a cross-coupled latch circuit coupled to the first and second input/output terminals, to a positive power supply voltage node, and to a negative power supply voltage node, wherein:
   the latch circuit is configured to latch, based on positive feedback, a logical value "0" or logical value "1" at the first or second input/output terminals, respectively, depending on a bit value stored in the resistive type memory cell;
   the logical value "1" corresponds to one of a positive voltage level of the positive power supply voltage node or a negative voltage level of the negative power supply voltage node;
   the logical value "0" corresponds to the other of the positive voltage level of the positive power supply voltage node or the negative voltage level of the negative power supply voltage node; and
   the resistive type memory cell is configured to be re-written by the latched positive voltage level or the latched negative voltage level, and
   wherein a voltage level of the first input/output terminal is configured to swing responsive to the reference line current multiplied by a resistance associated with the resistive type memory cell.

* * * * *